(12) United States Patent
Kaneyasu

(10) Patent No.: US 8,610,482 B2
(45) Date of Patent: Dec. 17, 2013

(54) TRIMMING CIRCUIT AND METHOD FOR DRIVING TRIMMING CIRCUIT

(75) Inventor: Makoto Kaneyasu, Hadano (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/477,747

(22) Filed: May 22, 2012

(65) Prior Publication Data

US 2012/0299639 A1     Nov. 29, 2012

(30) Foreign Application Priority Data

May 27, 2011 (JP) ................................ 2011-119429

(51) Int. Cl.
*H03K 5/00* (2006.01)

(52) U.S. Cl.
USPC .......................... 327/308; 333/81 R; 327/525

(58) Field of Classification Search
USPC ......... 327/306, 333, 524–525, 308; 333/81 R
See application file for complete search history.

(56) References Cited

U.S. PATENT DOCUMENTS

| | | | |
|---|---|---|---|
| 5,528,032 A | 6/1996 | Uchiyama | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,552,946 B2 * | 4/2003 | Yokozeki | 365/225.7 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Dinh T. Le
(74) *Attorney, Agent, or Firm* — Eric J. Robinson; Robinson Intellectual Property Law Office, P.C.

(57) ABSTRACT

A highly reliable trimming circuit is provided. A rewritable trimming circuit is provided. A method for driving a highly reliable trimming circuit is provided. A method for driving a rewritable trimming circuit is provided. The trimming circuit includes a storage node connected to a source electrode or a drain electrode of a transistor whose off-state leakage current is extremely low and a transistor whose gate electrode is connected to the storage node. The trimming state of an element or a circuit connected in parallel to a source electrode and a drain electrode of the transistor whose gate electrode is connected to the storage node is controlled using the transistor whose off-state leakage current is extremely low.

10 Claims, 9 Drawing Sheets

(56) References Cited

U.S. PATENT DOCUMENTS

| | | | |
|---|---|---|---|
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,274,830 B2 * | 9/2012 | Tsumura | 365/185.18 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-123861 | 5/2007 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

(56) References Cited

OTHER PUBLICATIONS

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTS,", IDW '09 : Proceedings of the 16th International Display Workshops, 2009, pp. 689-692.

Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

(56) References Cited

OTHER PUBLICATIONS

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner c-axis charge 0 charge +1 charge 0 ab-plane charge −1 charge 0

- In
- Sn
- Zn
- O

- In
- Ga
- Zn
- O

TRIMMING CIRCUIT AND METHOD FOR DRIVING TRIMMING CIRCUIT

BACKGROUND OF THE INVENTION

1. Field of the Invention

The present invention relates to trimming circuits. The present invention also relates to methods for driving the trimming circuits.

2. Description of the Related Art

In a step of manufacturing an integrated circuit which needs a precise voltage level and a precise current value (e.g., an AD converter or a DA converter), it is necessary to employ a method for compensating for variations in characteristics that cannot be reduced by adjustment of manufacturing conditions.

Further, in a step of manufacturing an integrated circuit which needs high yield (e.g., a high capacity storage device), it is necessary to employ a method for switching a connection to a built-in redundant circuit.

A circuit called a trimming circuit is used for such applications. A trimming circuit determines whether an element or a circuit connected in parallel to the trimming circuit is made to be available or unavailable. The state where the element or the circuit connected in parallel to the trimming circuit is unavailable is referred to as a trimming state. For example, a fuse, a zener zap diode, or the like is used as a conventional trimming circuit.

A transistor including an oxide semiconductor in a channel formation region has been known (Patent Document 1). Since an oxide semiconductor layer can be comparatively easily formed by sputtering or the like, the transistor including an oxide semiconductor in a channel formation region can be easily formed.

REFERENCE

Patent Document 1: Japanese Published Patent Application No. 2007-123861.

SUMMARY OF THE INVENTION

A fuse, a zener zap diode, or the like has a problem in reliability in some cases. For example, after a fuse is burned out with a laser by a laser cut method, a residue exists in a cut area and a circuit is not broken correctly in some cases.

Once a conventional trimming circuit including an irreversible element such as a fuse or a zener zap diode is broken, it is impossible to restore the conventional trimming circuit to the original state. Thus, there are problems in that trimming cannot be performed again and that rewriting cannot be performed.

One embodiment of the present invention is made in view of the technical background. It is an object of one embodiment of the present invention to provide a highly reliable trimming circuit. Alternatively, it is an object of one embodiment of the present invention to provide a rewritable trimming circuit. Alternatively, it is an object of one embodiment of the present invention to provide a method for driving a highly reliable trimming circuit. Alternatively, it is an object of one embodiment of the present invention to provide a method for driving a rewritable trimming circuit.

In order to achieve the above object, one embodiment of the present invention focuses on a structure where a switch is kept in a set state for a long time without physical breaking of a circuit. Further, a structure is contemplated in which a storage node connected to a source electrode or a drain electrode of a transistor whose off-state leakage current is extremely low and a transistor whose gate is connected to the storage node are provided. Furthermore, a method is contemplated by which the trimming state of an element or a circuit connected in parallel to a source electrode and a drain electrode of the transistor whose gate electrode is connected to the storage node is controlled using the transistor whose off-state leakage current is extremely low, and the above object can be achieved.

One embodiment of the present invention is a trimming circuit that includes a capacitor, a first transistor, a second transistor, and a third transistor. One electrode of the capacitor is electrically connected to a storage node, and the other electrode of the capacitor is electrically connected to a ground potential line. A gate electrode of the first transistor is electrically connected to a write terminal; one of a source electrode and a drain electrode of the first transistor is electrically connected to the storage node; and the other of the source electrode and the drain electrode of the first transistor is electrically connected to a power supply potential line. A gate electrode of the second transistor is electrically connected to an erase terminal; one of a source electrode and a drain electrode of the second transistor is electrically connected to the storage node; and the other of the source electrode and the drain electrode of the second transistor is electrically connected to a ground potential line. A gate electrode of the third transistor is electrically connected to the storage node. The first transistor and the second transistor each include a semiconductor material whose bandgap is 2.5 eV or more in a channel formation region. A source electrode and a drain electrode of the third transistor are connected in parallel to a resistor.

The trimming circuit according to one embodiment of the present invention has the first transistor and the second transistor each including a semiconductor material whose bandgap is 2.5 eV or more in a channel formation region and the storage node to which one of the source electrode and the drain electrode of the first transistor, one of the source electrode and the drain electrode of the second transistor, the gate electrode of the third transistor, and one electrode of the capacitor are connected. The transistor including a semiconductor material whose bandgap is 2.5 eV or more in a channel formation region has low off-state leakage current. The storage node with such a structure has an excellent ability to hold electric charge, and can stably keep the operating state of the third transistor whose gate electrode is connected to the storage node. Thus, the operating state of the third transistor can be kept for a long time without a change in structure of the component (for example, without damage to the element or the wiring). Consequently, a highly reliable trimming circuit can be provided.

Further, in the trimming circuit according to one embodiment of the present invention, the operating state of the third transistor can be changed without an irreversible change in structure of the component. Thus, the operating state of the third transistor can be changed a number of times. Consequently, a rewritable trimming circuit can be provided.

One embodiment of the present invention is a trimming circuit that includes a capacitor, a first transistor, a second transistor, and a third transistor. One electrode of the capacitor is electrically connected to a storage node, and the other electrode of the capacitor is electrically connected to a ground potential line. A gate electrode of the first transistor is electrically connected to a write terminal; one of a source electrode and a drain electrode of the first transistor is electrically connected to the storage node; and the other of the source electrode and the drain electrode of the first transistor is electrically connected to a power supply potential line. A gate electrode of the second transistor is electrically connected to an erase terminal; one of a source electrode and a drain electrode of the second transistor is electrically connected to the storage node; and the other of the source electrode and the drain electrode of the second transistor is electrically connected to a ground potential line. A gate electrode of the third transistor is electrically connected to the storage node. Off-state leakage current per micrometer of channel width of each of the first transistor and the second transistor is $1 \times 10^{-17}$ A or lower. A source electrode and a drain electrode of the third transistor are connected in parallel to a resistor.

The trimming circuit according to one embodiment of the present invention has the first transistor and the second transistor each having extremely low off-state leakage current and the storage node to which one of the source electrode and the drain electrode of the first transistor, one of the source electrode and the drain electrode of the second transistor, the gate electrode of the third transistor, and one electrode of the capacitor are connected. Specifically, the first transistor and the second transistor each include an oxide semiconductor layer in a channel formation region and have an off-state leakage current per micrometer of channel width of $1 \times 10^{-17}$ A or lower. The storage node with such a structure has an excellent ability to hold electric charge, and can stably keep the operating state of the third transistor whose gate electrode is connected to the storage node. Thus, the operating state of the third transistor can be kept for a long time without a change in structure of the component (for example, without damage to the element or the wiring). Consequently, a highly reliable trimming circuit can be provided.

Further, in the trimming circuit according to one embodiment of the present invention, the operating state of the third transistor can be changed without an irreversible change in structure of the component. Thus, the operating state of the third transistor can be changed a number of times. Consequently, a rewritable trimming circuit can be provided.

One embodiment of the present invention is the trimming circuit that includes the first transistor and the second transistor each including an oxide semiconductor layer in a channel formation region.

The trimming circuit according to one embodiment of the present invention has the first transistor and the second transistor each having extremely low off-state leakage current and the storage node to which one of the source electrode and the drain electrode of the first transistor, one of the source electrode and the drain electrode of the second transistor, the gate electrode of the third transistor, and one electrode of the capacitor are connected. Specifically, the first transistor and the second transistor each include an oxide semiconductor layer in a channel formation region. A transistor including an oxide semiconductor layer has extremely low off-state leakage current. An oxide semiconductor layer can be easily formed by sputtering or the like. Thus, a highly reliable trimming circuit can be easily provided. Further, the trimming circuit can be stacked over a different semiconductor device (e.g., a semiconductor device including a silicon single crystal). Consequently, a high-value-added semiconductor device can be provided.

One embodiment of the present invention is a method for driving a trimming circuit that includes a capacitor, a first transistor, a second transistor, and a third transistor. The driving method is a method for driving a trimming circuit setting a resistor in a trimming state. The driving method includes a first step of inputting a signal by which the first transistor is turned on and a signal by which the second transistor is turned off to a write terminal and an erase terminal, respectively, so that the potential of a storage node is a potential at which the third transistor is turned on, and a second step of inputting a signal by which the first transistor is turned off and a signal by which the second transistor is turned off to the write terminal and the erase terminal, respectively. One electrode of the capacitor is electrically connected to the storage node, and the other electrode of the capacitor is electrically connected to a ground potential line. A gate electrode of the first transistor is electrically connected to the write terminal; one of a source electrode and a drain electrode of the first transistor is electrically connected to the storage node; and the other of the source electrode and the drain electrode of the first transistor is electrically connected to a power supply potential line. A gate electrode of the second transistor is electrically connected to the erase terminal; one of a source electrode and a drain electrode of the second transistor is electrically connected to the storage node; and the other of the source electrode and the drain electrode of the second transistor is electrically connected to a ground potential line. A gate electrode of the third transistor is electrically connected to the storage node. Off-state leakage current per micrometer of channel width of each of the first transistor and the second transistor is $1 \times 10^{-17}$ A or lower. A source electrode and a drain electrode of the third transistor are connected in parallel to the resistor.

A method for driving the trimming circuit according to one embodiment of the present invention includes a step of setting the potential of the storage node to a potential at which the third transistor is turned on, and a step of turning off the first transistor whose source electrode or drain electrode is connected to the storage node and the second transistor whose source electrode or drain electrode is connected to the storage node. Thus, the operating state of the third transistor can be reversibly changed without a change in structure of any of the components in the trimming circuit. Consequently, a method for driving a highly reliable trimming circuit can be provided.

One embodiment of the present invention is a method for driving a trimming circuit that includes a capacitor, a first transistor, a second transistor, and a third transistor. The driving method is a method for driving a trimming circuit making a resistor available. The driving method includes a first step of inputting a signal by which the first transistor is turned off and a signal by which the second transistor is turned on to a write terminal and an erase terminal, respectively, so that the potential of a storage node is a potential at which the third transistor is turned off, and a second step of inputting a signal by which the first transistor is turned off and a signal by which the second transistor is turned off to the write terminal and the erase terminal, respectively. One electrode of the capacitor is electrically connected to the storage node, and the other electrode of the capacitor is electrically connected to a ground potential line. A gate electrode of the first transistor is electrically connected to the write terminal; one of a source electrode and a drain electrode of the first transistor is electrically connected to the storage node; and the other of the source electrode and the drain electrode of the first transistor is electrically connected to a power supply potential line. A gate electrode of the second transistor is electrically connected to the erase terminal; one of a source electrode and a drain electrode of the second transistor is electrically connected to the storage node; and the other of the source electrode and the drain electrode of the second transistor is electrically connected to a ground potential line. A gate electrode of the third transistor is electrically connected to the storage node. Off-state leakage current per micrometer of channel width of each of the first transistor and the second transistor is $1 \times 10^{-17}$ A or lower. A source electrode and a drain electrode of the third transistor are connected in parallel to the resistor.

A method for driving the trimming circuit according to one embodiment of the present invention includes a step of setting the potential of the storage node to a potential at which the third transistor is turned off, and a step of turning off the first transistor whose source electrode or drain electrode is connected to the storage node and the second transistor whose source electrode or drain electrode is connected to the storage node. Thus, the operating state of the third transistor can be reversibly changed without a change in structure of any of the components in the trimming circuit. Consequently, a method for driving a highly reliable trimming circuit can be provided.

One embodiment of the present invention is the method for driving the trimming circuit for changing the trimming state of a resistor. The driving method further includes a third step of making the potential of the storage node different from the potential of the storage node in the second step by inputting a signal by which the first transistor is turned on and a signal by which the second transistor is turned off to the write terminal and the erase terminal, respectively, so that the potential of the storage node is a potential at which the third transistor is turned on or by inputting a signal by which the first transistor is turned off and a signal by which the second transistor is turned on to the write terminal and the erase terminal, respectively, so that the potential of the storage node is a potential at which the third transistor is turned off, after the second step, and a fourth step of inputting a signal by which the first transistor is turned off and a signal by which the second transistor is turned off to the write terminal and the erase terminal, respectively.

A method for driving the trimming circuit according to one embodiment of the present invention includes a step of making the potential of the storage node different from the potential of the storage node before driving, and a step of turning off the first transistor whose source electrode or drain electrode is connected to the storage node and the second transistor whose source electrode or drain electrode is connected to the storage node. Thus, the operating state of the third transistor can be reversibly changed without a change in structure of any of the components in the trimming circuit. Consequently, a method for driving a rewritable trimming circuit can be provided.

According to one embodiment of the present invention, it is possible to provide a highly reliable trimming circuit. Alternatively, it is possible to provide a rewritable trimming circuit. Alternatively, it is possible to provide a method for driving a highly reliable trimming circuit. Alternatively, it is possible to provide a method for driving a rewritable trimming circuit.

DETAILED DESCRIPTION OF THE INVENTION

Figure 1:
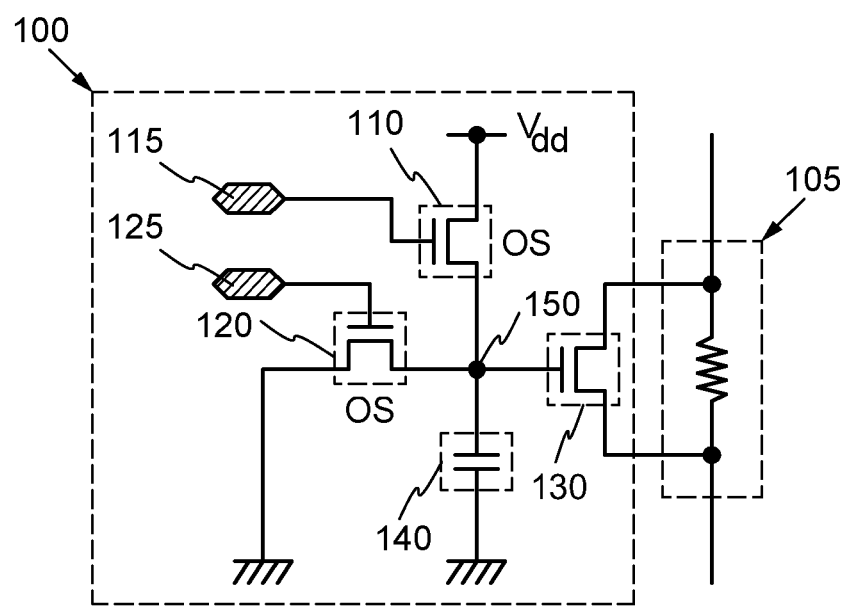
FIG. 1 illustrates the structure of a trimming circuit according to one embodiment.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. Note that in structures of the invention described below, the same portions or portions having similar functions are denoted by the same reference numerals in different drawings, and the description thereof is not repeated.

Embodiment 1

In this embodiment, the structure of a trimming circuit that includes a storage node connected to a source electrode or a drain electrode of a transistor whose off-state leakage current is extremely low and a transistor whose gate electrode is connected to the storage node is described with reference to FIG. 1.

FIG. 1 illustrates the structure of a trimming circuit according to one embodiment of the present invention. A trimming circuit 100 illustrated in FIG. 1 includes a capacitor 140, a first transistor 110, a second transistor 120, and a third transistor 130. Note that the first transistor 110 and the second transistor 120 each include a semiconductor material whose bandgap is 2.5 eV or more in a channel formation region and have extremely low off-state leakage current. When the off-state leakage current is extremely low, electric charge written to the storage node 150 can be held for a long time. For example, it is possible to use a transistor including an oxide semiconductor layer whose bandgap is 3.15 eV in a channel formation region and having an off-state leakage current per micrometer of channel width of $1 \times 10^{-17}$ A or lower.

A transistor including a semiconductor material whose bandgap is more than the bandgap (1.12 eV) of a silicon semiconductor in a channel formation region is preferably used as a transistor that can be used as each of the first transistor 110 and the second transistor 120. For example, a transistor including a semiconductor material whose bandgap is 2.5 eV or more, preferably 3.0 eV or more in a channel formation region, specifically, a transistor including an oxide semiconductor, a nitride semiconductor, an oxynitride semiconductor, a carbide semiconductor, a diamond thin film exhibiting semiconductor properties, or the like in a channel formation region can be used. A transistor including a semiconductor material whose bandgap is 2.5 eV or more in a channel formation region can have lower off-state leakage current than a transistor including a silicon semiconductor whose bandgap is 1.12 eV in a channel formation region.

Note that in order to reduce the off-state leakage currents of the first transistor and the second transistor, transistors with a variety of structures can be used. For example, a multi-gate transistor that includes a semiconductor layer having two or more channel formation regions connected in series may be used. Alternatively, a transistor having a space (also referred to as an offset) between a source electrode or a drain electrode and a channel formation region may be used.

One electrode of the capacitor 140 is electrically connected to the storage node 150, and the other electrode of the capacitor 140 is electrically connected to a ground potential line.

The storage node 150 is connected to the first transistor 110 and the second transistor 120 each including a semiconductor material whose bandgap is 2.5 eV or more in a channel formation region and having low off-state leakage current, and the capacitor 140. The capacitor 140 prevents the potential of the storage node 150 from becoming unstable due to surge current or the like and reliability is improved, which is preferable.

A gate electrode of the first transistor 110 is electrically connected to a write terminal 115. One of a source electrode and a drain electrode of the first transistor 110 is electrically connected to the storage node 150. The other of the source electrode and the drain electrode of the first transistor 110 is electrically connected to a power supply potential line. Note that a power supply potential $V_{dd}$ that is higher than a ground potential is supplied to the power supply potential line.

A gate electrode of the second transistor 120 is electrically connected to an erase terminal 125. One of a source electrode and a drain electrode of the second transistor 120 is electrically connected to the storage node 150. The other of the source electrode and the drain electrode of the second transistor 120 is electrically connected to a ground potential line.

A gate electrode of the third transistor 130 is electrically connected to the storage node 150. A source electrode and a drain electrode of the third transistor 130 are connected in parallel to a resistor 105.

One electrode of the capacitor 140 is connected to the storage node 150. The storage node 150 is electrically separated from the power supply potential line with the first transistor 110 whose off-state leakage current is extremely low and is electrically separated from the ground potential line with the second transistor 120 whose off-state leakage current is extremely low. The storage node 150 can stably hold written electric charge for a long time.

When the gate electrode of the third transistor 130 is connected to the storage node 150 that can stably hold written electric charge for a long time, the operating state (specifically either an on state or an off state) of the third transistor 130 can be held for a long time through the gate electrode of the third transistor 130.

Further, with this structure, the operating state of the third transistor 130 can be kept for a long time without an irreversible change in structure of any of the components; thus, reliability is particularly high. Thus, the operating state of the third transistor 130 can be changed a number of times by rewriting of the potential of the storage node 150 without an irreversible change in structure.

According to one embodiment of the present invention, it is possible to provide a highly reliable trimming circuit. Alternatively, it is possible to provide a rewritable trimming circuit.

Note that this embodiment can be combined with any of the other embodiments in this specification as appropriate.

Embodiment 2

Figure 2A:
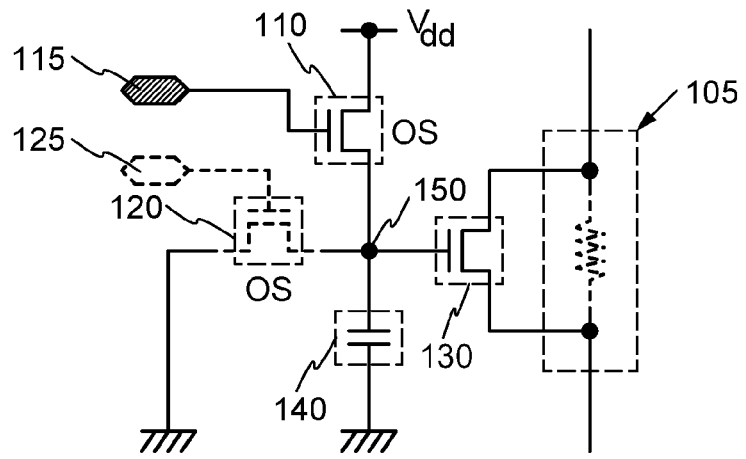
FIGS. 2A to 2C illustrate the operation of a trimming circuit according to one embodiment.

In this embodiment, methods for driving a trimming circuit that includes a storage node connected to a source electrode or a drain electrode of a transistor whose off-state leakage current is extremely low and a transistor whose gate electrode is connected to the storage node are described with reference to FIGS. 2A to 2C. Specifically, methods for driving the trimming circuit 100 illustrated in Embodiment 1 are described.

Example 1 of Driving Method

First, a method for making elements and circuits connected in parallel to the trimming circuit unavailable (setting the elements and the circuits connected in parallel to the trimming circuit in a trimming state) is described with reference to FIGS. 2A and 2C.

A signal by which the first transistor 110 is turned on is input to the write terminal 115, and a signal by which the second transistor 120 is turned off is input to the erase terminal 125. Accordingly, the storage node 150 is connected to the power supply potential line through the first transistor 110, and electric charge is accumulated in the storage node 150 connected to the capacitor 140. Further, the third transistor whose gate electrode is connected to the storage node 150 is turned on, so that current flows to the third transistor through the source electrode and the drain electrode of the third transistor. Note that the steps so far are referred to as a first step of the driving method in Example 1 (see FIG. 2A).

Then, a signal by which the first transistor 110 is turned off is input to the write terminal 115, and a signal by which the second transistor 120 is turned off is input to the erase terminal 125. Accordingly, the storage node 150 is electrically separated from the power supply potential line and the ground potential line, and the electric charge written to the storage node 150 is held. Note that the steps so far are referred to as a second step of the driving method in Example 1 (see FIG. 2C).

The method for driving the trimming circuit 100 according to one embodiment of the present invention includes the first step of setting the potential of the storage node 150 to a potential at which the third transistor 130 is turned on, and the second step of turning off the first transistor 110 whose source electrode or drain electrode is connected to the storage node 150 and the second transistor 120 whose source electrode or drain electrode is connected to the storage node 150. Thus, more current can flow to the third transistor 130 than to the resistor 105 without a change in structure of any of the components in the trimming circuit 100. Consequently, a method for driving a highly reliable trimming circuit can be provided.

Example 2 of Driving Method

Next, a method for making elements and circuits connected in parallel to the trimming circuit available is described with reference to FIGS. 2B and 2C.

A signal by which the first transistor 110 is turned off is input to the write terminal 115, and a signal by which the second transistor 120 is turned on is input to the erase terminal 125. Accordingly, the storage node 150 is connected to the ground potential line through the second transistor 120, and the potential of the storage node 150 is equal to the ground potential. Further, the third transistor whose gate electrode is connected to the storage node 150 is turned off, so that current flows to the resistor 105 connected in parallel to the source electrode and the drain electrode of the third transistor. Note that the steps so far are referred to as a first step of the driving method in Example 2 (see FIG. 2B).

Then, a signal by which the first transistor 110 is turned off is input to the write terminal 115, and a signal by which the second transistor 120 is turned off is input to the erase terminal 125. Accordingly, the storage node 150 is electrically separated from the power supply potential line and the ground potential line, and electric charge written to the storage node 150 is held. Note that the steps so far are referred to as a second step of the driving method in Example 2 (see FIG. 2C).

The method for driving the trimming circuit 100 according to one embodiment of the present invention includes the first step of setting the potential of the storage node 150 to a potential at which the third transistor 130 is turned off, and the second step of turning off the first transistor 110 whose source electrode or drain electrode is connected to the storage node 150 and the second transistor 120 whose source electrode or drain electrode is connected to the storage node 150. Thus, more current can flow to the resistor 105 connected in parallel to the source electrode and the drain electrode of the third transistor 130 without a change in structure of any of the components in the trimming circuit 100. Consequently, a method for driving the highly reliable trimming circuit 100 can be provided.

Example 3 of Driving Method

Next, a method for changing the setting of the trimming circuit 100 which is in a trimming state by the driving method in Example 1 or the driving method in Example 2 is described.

Figure 2B:
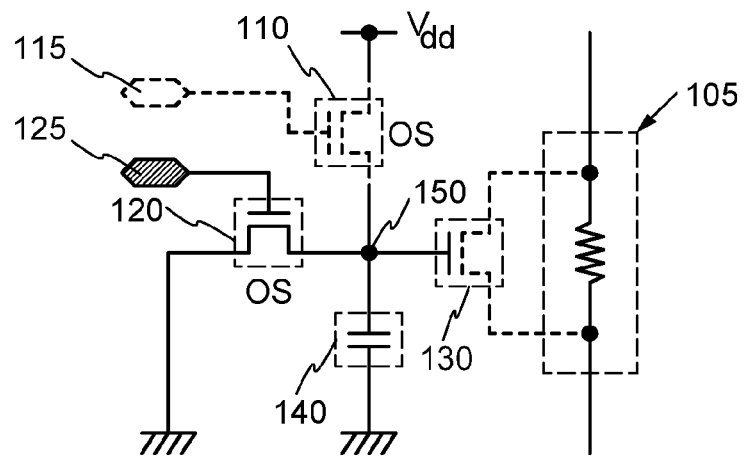
Figure 2C:
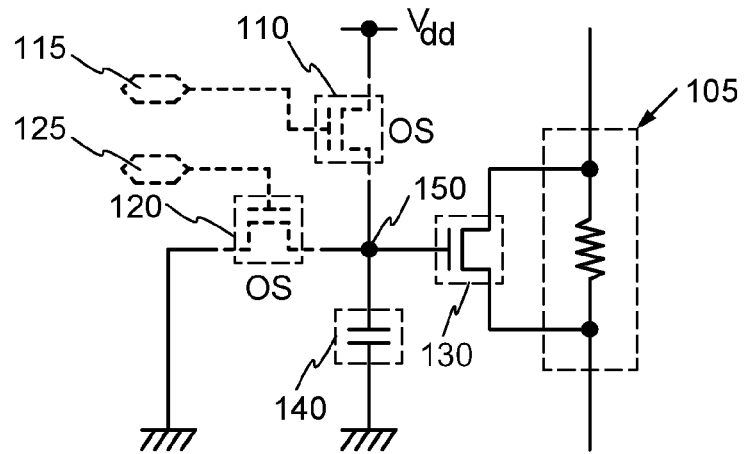

The potential of the storage node 150 which is in a trimming state is rewritten by the driving method in Example 1 or the driving method in Example 2 after a signal by which the first transistor 110 is turned on and a signal by which the second transistor 120 is turned off are input to the write terminal 115 and the erase terminal 125, respectively, so that the potential of the storage node 150 is a potential at which the third transistor 130 is turned on (see FIG. 2A) or a signal by which the first transistor 110 is turned off and a signal by which the second transistor 120 is turned on are input to the write terminal 115 and the erase terminal 125, respectively, so that the potential of the storage node 150 is a potential at which the third transistor 130 is turned off (see FIG. 2B). Note that the steps so far are referred to as a third step of the driving method in Example 3 because the steps are performed after the first step and the second step of either the driving method in Example 1 or the driving method in Example 2.

Then, a signal by which the first transistor 110 is turned off is input to the write terminal 115, and a signal by which the second transistor 120 is turned off is input to the erase terminal 125. Accordingly, the storage node 150 is electrically separated from the power supply potential line and the ground potential line, and electric charge written to the storage node 150 is held. Note that the steps so far are referred to as a fourth step of the driving method in Example 3 (see FIG. 2C).

The method for driving the trimming circuit 100 according to one embodiment of the present invention includes the third step of making the potential of the storage node 150 different from the potential before driving the trimming circuit 100 by the driving method in Example 3, and the fourth step of turning off the first transistor 110 whose source electrode or drain electrode is connected to the storage node 150 and the second transistor 120 whose source electrode or drain electrode is connected to the storage node 150. Thus, the operating state of the third transistor 130 can be changed without a change in structure of any of the components in the trimming circuit. Consequently, a method for driving the rewritable trimming circuit 100 can be provided.

Modification Example

In the driving method in Example 3, the operating state of the third transistor 130 is changed; however, a driving method by which the operating state of the third transistor 130 is not changed, signals are input to the write terminal 115 and the erase terminal 125, and data is written can also be one embodiment of the present invention.

The trimming circuit according to one embodiment of the present invention includes transistors whose off-state leakage currents are extremely low as the first transistor 110 and the second transistor 120, and can hold electric charge written to the storage node 150 for a long time. Here, when signals are input to the write terminal 115 and the erase terminal 125 so that the storage node 150 continuously holds the electric charge, reliability can be further improved.

Note that this embodiment can be combined with any of the other embodiments in this specification as appropriate.

Embodiment 3

In this embodiment, the structure of a trimming circuit according to one embodiment of the present invention is described with reference to FIGS. 3A to 3C. Specifically, the structure of a trimming circuit that includes a transistor having a semiconductor other than an oxide semiconductor and a transistor having an oxide semiconductor layer in a channel formation region is described.

Figure 3A:
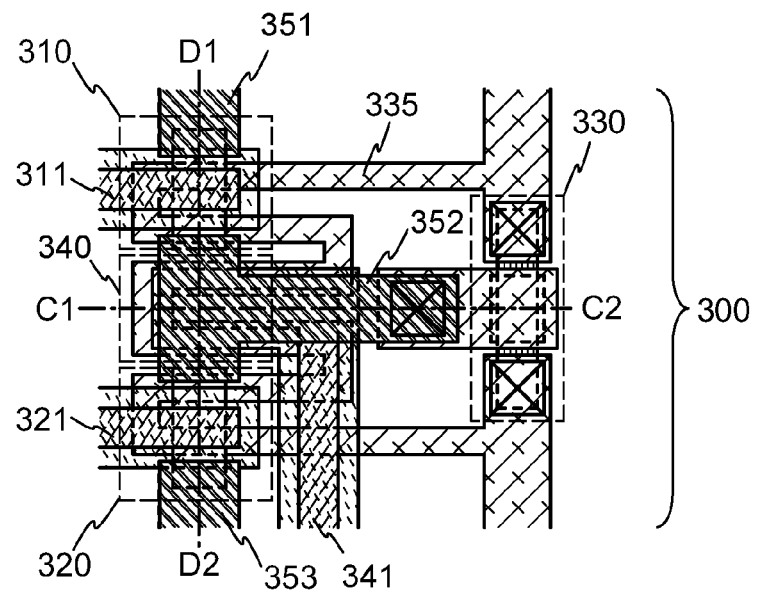
FIGS. 3A to 3C illustrate the structure of a trimming circuit according to one embodiment.
Figure 3B:
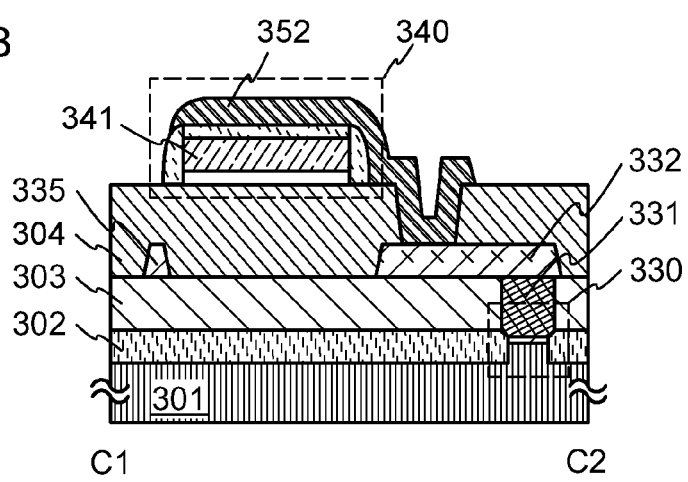
Figure 3C:
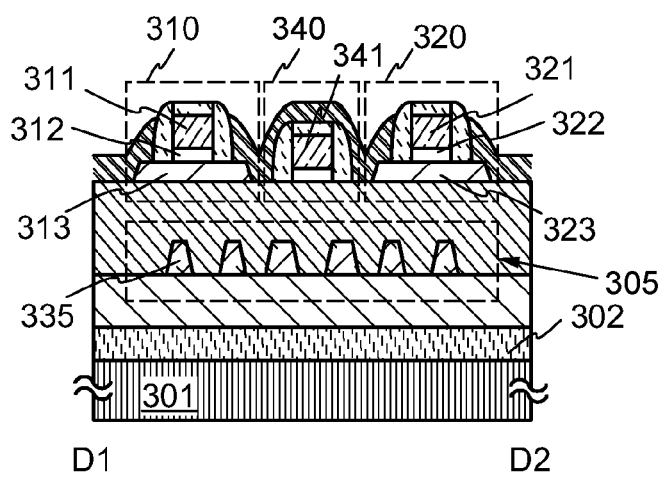

FIGS. 3A to 3C illustrate the structure of a trimming circuit according to one embodiment of the present invention. FIG. 3A is a top view of a trimming circuit 300. FIG. 3B is a cross-sectional view taken along section line C1-C2 in FIG. 3A. FIG. 3C is a cross-sectional view taken along section line D1-D2 in FIG. 3A.

The trimming circuit 300 illustrated in FIGS. 3A to 3C includes a third transistor 330, and a first transistor 310, a second transistor 320, and a capacitor 340 which are provided over a substrate 301 over which a resistor 305 is formed with an insulating layer 304 provided therebetween.

<Structures of Third Transistor and Resistor>

In this embodiment, a semiconductor material other than an oxide semiconductor is used for a channel formation region of the third transistor 330. Specifically, a silicon single crystal substrate is used as the substrate 301, and the third transistor 330 is formed on a surface of the silicon single crystal substrate (see FIG. 3B).

Note that the semiconductor material other than an oxide semiconductor can be, for example, silicon, germanium, silicon germanium, silicon carbide, gallium arsenide, or the like. Alternatively, an organic semiconductor material or the like may be used.

Any semiconductor material may be either non-single-crystal or single crystal. A single crystal semiconductor substrate is preferably used because a transistor which can operate at high speed can be obtained.

Alternatively, an SOI substrate or the like can be used. Although the term "SOI substrate" generally means a substrate where a silicon semiconductor film is provided on an insulating surface, the term "SOI substrate" in this specification and the like also means a substrate where a semiconductor film including a material other than silicon is provided on an insulating surface. That is, a semiconductor film included in the "SOI substrate" is not limited to a silicon semiconductor film. Further, the SOI substrate can be a substrate having a structure in which a semiconductor film is provided over an insulating substrate such as a glass substrate with an insulating layer provided therebetween.

An element isolation insulating layer 302 is provided to surround the third transistor 330. A gate electrode 331 of the third transistor 330 is electrically connected to a wiring 332 through an opening formed in an insulating layer 303.

Curved portions of a wiring 335 that is formed using the same conductive layer as the wiring 332 function as the resistor 305. The resistor 305 is connected in parallel to a source and drain electrodes of the third transistor 330 (see FIG. 3A).

<Structures of Capacitor, First Transistor, and Second Transistor>

The capacitor 340 includes an insulating layer provided between a wiring 341 and a wiring 352 and is provided over the insulating layer 304. Note that the wiring 352 is connected to the wiring 332 through an opening formed in the insulating layer 304 (see FIG. 3B).

The first transistor 310 includes an oxide semiconductor layer 313 provided over the insulating layer 304 and a gate insulating layer 312 provided between a wiring 311 functioning as a gate electrode and the oxide semiconductor layer 313. Note that the wiring 311 has insulating layers on its sidewalls and is insulated from a wiring 351 and the wiring 352 functioning as a source and drain electrodes (see FIG. 3C).

The second transistor 320 includes an oxide semiconductor layer 323 provided over the insulating layer 304 and a gate insulating layer 322 provided between a wiring 321 functioning as a gate electrode and the oxide semiconductor layer 323. Note that the wiring 321 has insulating layers on its sidewalls and is insulated from the wiring 352 and a wiring 353 functioning as a source and drain electrodes (see FIG. 3C).

The trimming circuit illustrated in this embodiment has the first transistor 310 and the second transistor 320 each having extremely low off-state leakage current. Specifically, the first transistor 310 and the second transistor 320 each include an oxide semiconductor layer in a channel formation region and have an off-state leakage current per micrometer of channel width of $1 \times 10^{-17}$ A or lower. When the off-state leakage current is extremely low (for example, off-state leakage current per micrometer of channel width is $1 \times 10^{-17}$ A or lower), electric charge written to a storage node can be held for a long time.

The trimming circuit illustrated in this embodiment further includes a transistor having an oxide semiconductor layer. The transistor having an oxide semiconductor layer is provided over a substrate over which a transistor having a semiconductor other than an oxide semiconductor is formed. With such a structure, for example, a transistor which has a semiconductor other than an oxide semiconductor and operates at high speed can be used in combination with a transistor which has an oxide semiconductor whose off-state leakage current is low. Consequently, it is possible to provide a trimming circuit taking advantages of a semiconductor other than an oxide semiconductor and an oxide semiconductor whose off-state leakage current is low, and a semiconductor device including the trimming circuit.

Further, the trimming circuit illustrated in this embodiment has a layered structure. Specifically, the transistors each having an oxide semiconductor layer and the resistor overlap with each other. Accordingly, the area of the trimming circuit can be decreased. Further, a semiconductor device can be made small with the use of the trimming circuit.

Note that this embodiment can be combined with any of the other embodiments in this specification as appropriate.

Embodiment 4

In this embodiment, the structure of a transistor that can be used in a trimming circuit according to one embodiment of the present invention is described. Specifically, the structure of a transistor that includes a semiconductor material whose bandgap is 2.5 eV or more in a channel formation region is described. Note that a method for forming a transistor illustrated in this embodiment will be described in Embodiment 5.

The structure of the transistor illustrated in this embodiment is described with reference to FIG. 4D. FIG. 4D illustrates a cross section of the transistor.

A transistor 710 illustrated in this embodiment includes, over a substrate 701, a base insulating layer 704, an oxide semiconductor layer 713, a gate insulating layer 712, a gate electrode 711, electrodes 751 and 752 functioning as a source and drain electrodes, and an insulating layer 705 for protecting the transistor.

<Structure of Base Insulating Layer>

The base insulating layer 704 has an insulating surface and serves as a base of the oxide semiconductor layer 713 in which a channel is formed.

The base insulating layer 704 may have either a single-layer structure of a layer including one or more materials selected from silicon oxide, silicon nitride, silicon oxynitride, silicon nitride oxide, aluminum oxide, aluminum nitride, aluminum oxynitride, aluminum nitride oxide, hafnium oxide, gallium oxide, and the like or a layered structure of two or more layers including one or more such materials, for example.

<Oxide Semiconductor Layer>

The oxide semiconductor layer 713 in which a channel is formed overlaps with the gate electrode 711 with the gate insulating layer 712 provided therebetween and is electrically connected to the electrodes 751 and 752 in which the gate electrode 711 is provided therebetween. Note that the electrodes 751 and 752 function as a source and drain electrodes.

The thickness of the oxide semiconductor layer 713 in which a channel is formed is 2 to 200 nm, preferably 5 to 30 nm.

Note that the oxide semiconductor layer 713 is not necessarily processed into an island shape.

The oxide semiconductor layer 713 can be single crystal, polycrystalline (also referred to as polycrystal), or amorphous, for example.

The oxide semiconductor layer is preferably a c-axis aligned crystalline oxide semiconductor (CAAC-OS) layer.

An example of a crystalline oxide semiconductor layer is an oxide semiconductor layer having c-axis aligned crystals (CAAC). Note that the oxide semiconductor layer having c-axis aligned crystals will be described in detail in Embodiment 7.

The proportion of oxygen in the oxide semiconductor layer 713 is preferably higher than the stoichiometric proportion. When the proportion of oxygen is higher than the stoichiometric proportion, generation of carriers caused by oxygen vacancies in a metal oxide layer can be inhibited.

The oxide semiconductor layer 713 preferably contains at least indium (In) or zinc (Zn). In particular, the oxide semiconductor layer 713 preferably contains In and Zn.

As a stabilizer for reducing variations in electrical characteristics of a transistor including the oxide semiconductor layer, the oxide semiconductor layer preferably contains gallium (Ga) in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

For example, indium oxide; tin oxide; zinc oxide; a binary metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a ternary metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a quaternary metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as an oxide semiconductor.

Here, for example, an In—Ga—Zn—O-based material means an oxide containing indium (In), gallium (Ga), and zinc (Zn), and there is no particular limitation on the composition ratio. Further, the In—Ga—Zn—O-based material may contain a metal element other than In, Ga, and Zn. For example, the In—Ga—Zn—O-based material may contain $SiO_2$.

A material represented by $InMO_3(ZnO)_m$ (m>0, where m is not an integer) may be used as the oxide semiconductor. Note that M denotes one or more metal elements selected from Ga, Fe, Mn, or Co. A material represented by $In_2SnO_5(ZnO)_n$ (n>0, where n is an integer) may be used as the oxide semiconductor.

However, without limitation to the materials given above, a material with an appropriate composition may be used depending on needed semiconductor characteristics (e.g., mobility, threshold voltage, and variations). In order to obtain needed semiconductor characteristics, it is preferable that carrier concentration, impurity concentration, defect density, an atomic ratio between a metal element and oxygen, interatomic distance, density, and the like be set to appropriate values.

<Gate Insulating Layer>

The gate insulating layer 712 can be formed using silicon oxide, silicon nitride, silicon oxynitride, silicon nitride oxide, gallium oxide, aluminum oxide, aluminum oxynitride, tantalum oxide, or the like.

The gate insulating layer 712 can be formed using a high dielectric constant (high-k) material. Examples of a high dielectric constant material include hafnium oxide, yttrium oxide, lanthanum oxide, hafnium silicate ($HfSi_xO_y$ (x>0, y>0)), hafnium aluminate ($HfAl_xO_y$ (x>0, y>0)), hafnium silicate to which nitrogen is added ($HfSi_xO_yN_z$ (x>0, y>0, z>0)), and hafnium aluminate to which nitrogen is added ($HfAl_xO_yN_z$ (x>0, y>0, z>0)).

The gate insulating layer 712 may have either a single-layer structure or a layered structure. For example, the gate insulating layer 712 may have a layered structure of a layer containing a high-k material and a layer containing a material selected from silicon oxide, silicon nitride, silicon oxynitride, silicon nitride oxide, aluminum oxide, or the like.

When the gate insulating layer 712 is made thin or formed using the high-k material, the transistor can be miniaturized without sacrificing operating characteristics.

For example, in the case where silicon oxide is used, the thickness of the gate insulating layer 712 can be 1 to 100 nm, preferably 10 to 50 nm.

In the case where a high-k material is used, the transistor can be miniaturized without making the transistor so thin that gate leakage due to a tunneling effect or the like is generated.

The gate insulating layer 712 can be formed using an insulating material containing a Group 13 element and oxygen. Note that an insulating material containing a Group 13 element means an insulating material containing one or more Group 13 elements.

Examples of the insulating material containing a Group 13 element and oxygen include gallium oxide, aluminum oxide, aluminum gallium oxide, and gallium aluminum oxide. Here, aluminum gallium oxide is a substance in which the aluminum content is higher than that of gallium in atomic percent (at. %), and gallium aluminum oxide is a substance in which the gallium content is higher than or equal to that of aluminum in atomic percent (at. %).

Many oxide semiconductor materials contain Group 13 elements, and an insulating material containing a Group 13 element works well with an oxide semiconductor material. Thus, by using an insulating material containing a Group 13 element and oxygen for the insulating layer which is in contact with the oxide semiconductor layer, the state of an interface with the oxide semiconductor layer can be kept well.

For example, in the case where a gate insulating layer is formed in contact with an oxide semiconductor layer containing gallium, when a material containing gallium oxide is used for the gate insulating layer, favorable characteristics can be kept at the interface between the oxide semiconductor layer and the gate insulating layer.

When the oxide semiconductor layer and the insulating layer containing gallium oxide are provided in contact with each other, pile up of hydrogen at the interface between the oxide semiconductor layer and the insulating layer can be reduced.

For example, it is effective to form an insulating layer with the use of a material containing aluminum oxide. Aluminum oxide does not easily transmit water. Thus, it is preferable to use the material including aluminum oxide in order to prevent water from entering the oxide semiconductor layer.

A similar effect can be obtained in the case where an element that belongs to the same group as a constituent element of the oxide semiconductor is used for the insulating layer.

<Gate Electrode>

The gate electrode 711 overlaps with the oxide semiconductor layer 713 with the gate insulating layer 712 provided therebetween, and functions as a gate electrode of the transistor 710.

The gate electrode 711 may have either a single-layer structure of a layer containing a conductive material or a layered structure of two or more layers each containing a conductive material.

Any conductive material may be used as long as it can withstand heat treatment. For example, a metal selected from molybdenum, titanium, tantalum, tungsten, aluminum, copper, neodymium, scandium, or the like, or an alloy containing the metal can be used.

Alternatively, a semiconductor layer typified by a polycrystalline silicon film doped with an impurity element such as phosphorus, or a silicide layer such as a nickel silicide layer may be used.

<Insulating Layer over Gate Electrode and Sidewalls>

An insulating layer 714a over the gate electrode overlaps with the gate electrode 711 and has insulating properties.

Sidewalls 714b are in contact with side surfaces of a stack of the gate insulating layer 712, the gate electrode 711, and the insulating layer 714a over the gate electrode, and include an insulating layer.

<Source Electrode and Drain Electrode>

The electrodes 751 and 752 are electrically connected to the oxide semiconductor layer 713, and function as a source and drain electrodes of the transistor.

The electrode functioning as the source electrode or the drain electrode may have either a single-layer structure of a layer containing a conductive material or a layered structure of two or more layers each containing a conductive material.

Any conductive material may be used as long as it can withstand heat treatment. For example, a metal selected from aluminum, chromium, copper, titanium, tantalum, molybdenum, or tungsten, or an alloy containing the metal can be used. Alternatively, a metal selected from manganese, magnesium, zirconium, beryllium, neodymium, or scandium, or an alloy containing the metal can be used.

A metal nitride can be used as the conductive material. Specific examples of the metal nitride include titanium nitride, molybdenum nitride, and tungsten nitride.

Alternatively, a conductive metal oxide can be used as the conductive material. Specifically, indium oxide, tin oxide, indium tin oxide (also referred to as ITO), indium zinc oxide, zinc oxide, zinc oxide to which gallium or aluminum is added, or the metal oxide material which contains silicon oxide can be used.

Alternatively, graphene or the like can be used as the conductive material.

For example, a single-layer structure of titanium or titanium nitride, a single-layer structure of aluminum containing silicon, a two-layer structure in which a titanium layer is stacked over an aluminum layer, a two-layer structure in which a titanium layer is stacked over a titanium nitride layer, a three-layer structure in which a titanium layer, an aluminum layer, and a titanium layer are stacked, or the like may be employed.

Note that the channel length L of the transistor depends on a distance between an end of the source electrode which is in contact with the oxide semiconductor layer and an end of the drain electrode which is in contact with the oxide semiconductor layer.

<Insulating Layer for Protecting Transistor>

The insulating layer 705 prevents entry of an impurity such as moisture from the outside to protect the transistor.

The thickness of the insulating layer 705 is at least 1 nm or more.

The insulating layer 705 may have either a single-layer structure of a layer including an insulator having a barrier property or a layered structure of two or more layers each including an insulator having a barrier property.

In particular, a structure in which aluminum oxide is contained is preferable, and a layered structure of an aluminum oxide layer and a layer including another inorganic insulating material may be employed. This is because aluminum oxide does not easily transmit moisture, oxygen, and another impurity.

Alternatively, the insulating layer 705 may have a stack of an oxide insulating layer having an oxygen excess region and an aluminum oxide layer. The oxide insulating layer having an oxygen excess region may be provided on the oxide semiconductor layer side.

For example, a silicon oxide film, a silicon oxynitride film, or the like can be used for the oxide insulating layer having an oxygen excess region.

This embodiment can be combined with any of the structures described in the other embodiments as appropriate.

Embodiment 5

In this embodiment, a method for forming the transistor 710 which includes a semiconductor material whose bandgap is 2.5 eV or more in a channel formation region in Embodiment 4 is described with reference to FIGS. 4A to 4D.

<Formation of Base Insulating Layer>

First, the insulating layer 704 that serves as a base of an oxide semiconductor layer having a channel is formed. The base insulating layer 704 is formed over the substrate 701 by plasma-enhanced CVD, sputtering, or the like.

Any substrate can be used as the substrate 701 as long as it has heat resistance high enough to withstand treatment performed after the formation of the base insulating layer, and there is no limitation on the size of the substrate 701.

Another semiconductor element may be provided on the substrate 701 in advance.

For example, a glass substrate such as a barium borosilicate glass substrate or an aluminoborosilicate glass substrate, a ceramic substrate, a quartz substrate, a sapphire substrate, or the like can be used as the substrate 701. Alternatively, a single crystal semiconductor substrate or a polycrystalline semiconductor substrate made of silicon or silicon carbide, a compound semiconductor substrate made of silicon germanium or the like, an SOI substrate, or the like can be used.

A flexible substrate may be used as the substrate 701. A transistor may be directly formed over a flexible substrate. Alternatively, a transistor may be formed over a manufacturing substrate, and then, the transistor may be separated from the manufacturing substrate and transferred to a flexible substrate. Note that in the case where the transistor is separated from the manufacturing substrate and is transferred to the flexible substrate, a release layer is preferably provided between the manufacturing substrate and the transistor including an oxide semiconductor layer.

<Formation of Oxide Semiconductor Layer>

Next, the oxide semiconductor layer 713 which has a channel is formed over the base insulating layer 704.

The oxide semiconductor layer can be formed by sputtering, molecular beam epitaxy, atomic layer deposition, or pulsed laser deposition.

For example, in the case where an In—Ga—Zn—O-based material is used for the oxide semiconductor, the oxide semiconductor layer can be formed using a target. A variety of materials and a variety of composition ratios can be used as the material and composition ratio of the target. For example, an oxide target having a composition ratio of $In_2O_3$:$Ga_2O_3$:ZnO=1:1:1 in a molar ratio can be used. Alternatively, an oxide target having a composition ratio of $In_2O_3$:$Ga_2O_3$:ZnO=1:1:2 in a molar ratio can be used, for example.

In the case where an In—Zn—O-based material is used for the oxide semiconductor, a target used has an atomic ratio of In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, a target used for formation of an In—Zn—O-based oxide semiconductor has a composition ratio of In:Zn:O=X:Y:Z in an atomic ratio, where Z>1.5X+Y.

For example, in the case where an In—Sn—Zn—O-based material is used for the oxide semiconductor, the oxide semiconductor layer can be formed using a target. A variety of composition ratios can be used as the composition ratio of the target. For example, an oxide target having a composition ratio of In:Sn:Zn=1:2:2 in an atomic ratio can be used. Alternatively, an oxide target having a composition ratio of In:Sn:Zn=2:1:3 in an atomic ratio can be used, for example. Alternatively, an oxide target having a composition ratio of In:Sn:Zn=1:1:1 in an atomic ratio can be used, for example. Alternatively, an oxide target having a composition ratio of In:Sn:Zn=20:45:35 in an atomic ratio can be used, for example.

Note that the relative density of the target is 90 to 100%, preferably 95 to 99.9%. With the use of a target having high relative density, a dense oxide semiconductor layer can be formed.

Further, the oxide semiconductor layer can be substantially intrinsic by a decrease in carrier density. Such a method will be described in detail in Embodiment 6.

Figure 4A:
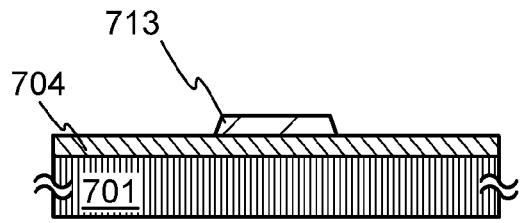
FIGS. 4A to 4D illustrate a method for forming a trimming circuit according to one embodiment.

Then, a resist mask is formed through a photolithography process, and the oxide semiconductor layer is selectively etched using the resist mask to be processed into an island shape (see FIG. 4A).

Note that when the etching is performed while the resist mask is eroded, the oxide semiconductor layer can be tapered. When the island-shaped oxide semiconductor layer is tapered, disconnection of a layer to be formed after this step can be prevented, so that coverage can be improved.

<Formation of Gate Insulating Layer, Gate Electrode, and Insulating Layer over Gate Electrode>

Then, a stack of the gate insulating layer 712, the gate electrode 711, and the insulating layer 714a over the gate electrode is formed over the oxide semiconductor layer 713.

An insulating layer serving as the gate insulating layer and an insulating layer serving as the insulating layer over the gate electrode are formed by plasma-enhanced CVD, sputtering, or the like.

A conductive layer serving as the gate electrode is formed by sputtering or the like.

Next, a resist mask is formed through a photolithography process, and the insulating layer serving as the gate insulating layer, the conductive layer serving as the gate electrode, and the insulating layer serving as the insulating layer over the gate electrode are etched using the resist mask so that the stack of the gate insulating layer 712, the gate electrode 711, and the insulating layer 714a over the gate electrode is formed.

<Formation of Sidewalls>

Then, the sidewalls 714b are formed in contact with side surfaces of the stack of the gate insulating layer 712, the gate electrode 711, and the insulating layer 714a over the gate electrode.

An insulating layer serving as sidewalls is formed by plasma-enhanced CVD, sputtering, or the like.

Figure 4B:
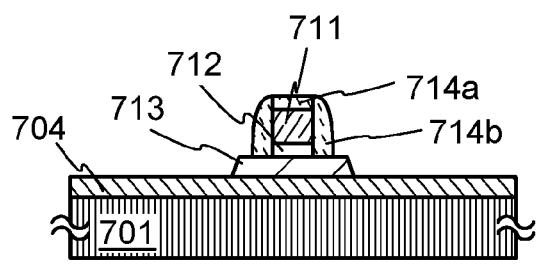

Next, the sidewalls are formed by anisotropic etching while the insulating layer which is in contact with the side surfaces of the stack remains (see FIG. 4B).

<Formation of Electrodes Functioning as Source and Drain Electrodes>

Then, the electrodes 751 and 752 functioning as a source and drain electrodes are formed.

A layer which functions as a source and drain electrodes and contains a conductive material is formed by sputtering or the like.

Figure 4C:
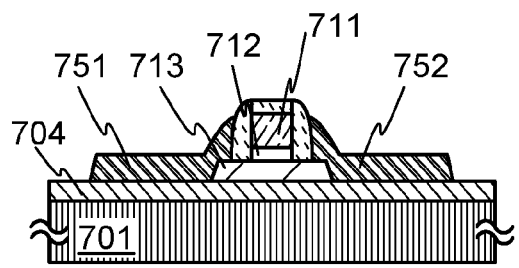
Figure 4D:
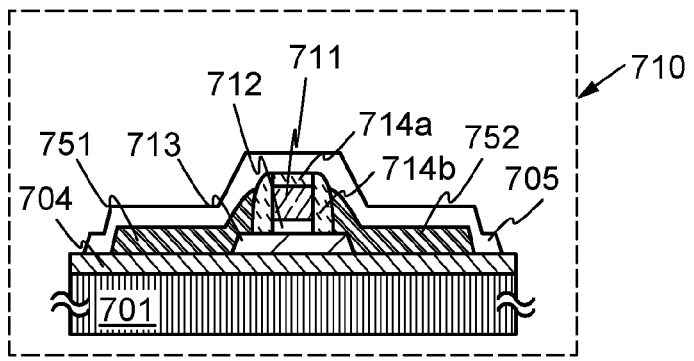

Then, a resist mask is formed through a photolithography process, and the layer containing a conductive material is selectively etched using the resist mask so that the electrodes 751 and 752 are formed (see FIG. 4C). Note that a wiring and the like (not illustrated) made of the layer containing a conductive material are formed in the same step.

Note that in the case where the channel length L of the transistor is 10 nm to 1000 nm (1 μm), especially less than 25 nm, a mask is preferably formed with an extreme ultraviolet ray whose wavelength is several nanometers to several tens of nanometers. This is because an extreme ultraviolet ray can provide a high resolution and a large focus depth.

Note that the electrodes functioning as a source and drain electrodes are preferably tapered. When the electrodes functioning as a source and drain electrodes are tapered, disconnection of a layer to be formed after this step (e.g., a gate insulating layer) can be prevented, so that coverage can be improved. The taper angle is preferably 30 to 60°, for example.

Note that in the case where the layer containing a conductive material has a single-layer structure of a titanium layer or a titanium nitride layer, the layer containing a conductive material can be easily processed into a tapered source and drain electrodes.

<Formation of Insulating Layer for Protecting Transistor>

Next, the insulating layer 705 for protecting the transistor is formed.

The insulating layer for protecting the transistor is formed by plasma-enhanced CVD, sputtering, or the like.

Through the above steps, the transistor 710 which includes an oxide semiconductor material in a region where a channel is formed can be obtained.

Note that the resist mask used in this embodiment is not limited to a resist mask formed through a photolithography process. The resist mask can be formed by an inkjet method, a printing method, or the like as appropriate instead of photolithography. When the resist mask is formed without the use of a photomask, the manufacturing cost of a semiconductor device can be reduced.

This embodiment can be combined with any of the structures described in the other embodiments as appropriate.

Embodiment 6

In this embodiment, a method for forming an oxide semiconductor layer applicable to a transistor which has extremely low off-state leakage current (for example, off-state leakage current per micrometer of channel width is $1 \times 10^{-17}$ A or lower) and can be used in a trimming circuit according to one embodiment of the present invention is described. Specifically, a method for forming a substantially intrinsic oxide semiconductor layer whose carrier density is low is described with reference to FIGS. 5A to 5D.

<Structure and Formation Method of Base Insulating Layer>

At least a region of an insulating layer 504 serving as a base of an oxide semiconductor layer having a channel that is in contact with the oxide semiconductor layer preferably includes an insulating layer from which oxygen is eliminated by heat treatment. This is because when the insulating layer 504 has an oxygen excess region, transfer of oxygen from the oxide semiconductor layer to the insulating layer 504 can be prevented and oxygen can be supplied from the insulating layer 504 to the oxide semiconductor layer by heat treatment to be performed later.

In the case where the base insulating layer has a layered structure, an oxide insulating layer having an oxygen excess region is preferably provided on the oxide semiconductor layer side.

For example, the base insulating layer preferably has a structure in which a silicon oxide layer having an oxygen excess region and an aluminum oxide layer are stacked in that order from the oxide semiconductor layer side.

Note that in this specification and the like, an expression "oxygen is eliminated by heat treatment" means that the amount of eliminated oxygen (or released oxygen) that is converted into oxygen atoms is $1.0 \times 10^{18}$ cm$^{-3}$ or more, preferably $3.0 \times 10^{20}$ cm$^{-3}$ or more in thermal desorption spectroscopy (TDS) analysis. An expression "oxygen is not eliminated by heat treatment" means that the amount of eliminated oxygen (or released oxygen) that is converted into oxygen atoms is less than $1.0 \times 10^{18}$ cm$^{-3}$ in TDS analysis.

As a method for forming an insulating layer from which oxygen is eliminated by heat treatment, there are a method for forming an insulating layer in an oxygen atmosphere and a method for forming an insulating layer and then introducing oxygen (including at least any of an oxygen radical, an oxygen atom, and an oxygen ion), for example.

Ion implantation, ion doping, plasma immersion ion implantation, plasma treatment, or the like can be used as a method for introducing oxygen.

<Method 1 for Forming Oxide Semiconductor Layer with Low Impurity Concentration: Deposition>

Figure 5A:
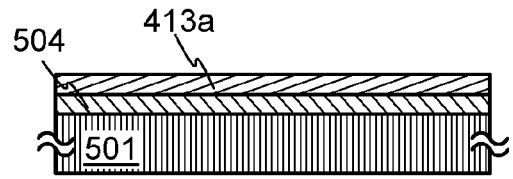
FIGS. 5A to 5D illustrate a method for forming a trimming circuit according to one embodiment.

An oxide semiconductor layer 413a is formed over the base insulating layer 504 (see FIG. 5A). The oxide semiconductor layer 413a is an oxide semiconductor layer in which a channel is formed later; thus, the oxide semiconductor layer 413a is formed so that impurities containing hydrogen atoms are removed as much as possible. This is because the impurity containing a hydrogen atom easily forms a donor level in the oxide semiconductor layer.

Sputtering is preferably used as a method for forming an oxide semiconductor layer in which impurities containing hydrogen atoms are reduced. In particular, it is preferable to use a method by which an insulating layer which is not exposed to the air serves as a base and an oxide semiconductor layer is formed following the formation of the insulating layer.

For example, after impurities containing hydrogen that attach to a surface of the substrate are removed by heat treatment or plasma treatment, the base insulating layer may be formed without exposure to the air, and the oxide semiconductor layer may be successively formed without exposure to the air. In this manner, impurities containing hydrogen that attach to a surface of the base insulating layer can be reduced, and an atmospheric component can be prevented from attaching to an interface between the substrate and the base insulating layer and an interface between the base insulating layer and the oxide semiconductor layer.

Note that before the oxide semiconductor layer is formed by sputtering, powder substances (also referred to as particles or dust) which attach to the surface of the base insulating layer are preferably removed by reverse sputtering in which an argon gas is introduced into a treatment chamber and plasma is generated.

The reverse sputtering is a method in which, without application of voltage to a target side, an RF power source is used for application of voltage to a substrate side in an argon atmosphere and plasma is generated in the vicinity of the substrate so that a substrate surface is modified. Note that nitrogen, helium, oxygen, or the like may be used instead of the argon atmosphere.

Further, the oxide semiconductor layer is preferably formed using a treatment chamber whose leakage rate is low. Specifically, when the leakage rate of a treatment chamber of a sputtering apparatus is set to $1 \times 10^{-10}$ Pa·m$^3$/s or lower, mixing of impurities such as alkali metal or hydride into the oxide semiconductor layer that is being deposited can be reduced.

Alternatively, the oxide semiconductor layer is preferably formed using a treatment chamber of a sputtering apparatus exhausted by an adsorption vacuum pump (e.g., a cryopump). Counter flow of impurities such as alkali metal, a hydrogen atom, a hydrogen molecule, water, a hydroxyl group, or hydride from an evacuation system can be reduced.

Alternatively, the oxide semiconductor layer is preferably formed under the condition that a high-purity atmosphere gas is supplied to a treatment chamber of a sputtering apparatus. Specifically, oxygen, a high-purity rare gas (typically argon) from which impurities such as water, a compound having a hydroxyl group, and hydride are removed, or a mixed gas of a rare gas and oxygen is used as appropriate.

For example, the purity of argon is set to 9N (99.9999999%) or higher (the concentration of H$_2$O is 0.1 ppb, and the concentration of H$_2$ is 0.5 ppb), and the dew point of argon is set to −121° C. The purity of oxygen is set to 8N (99.999999%) or higher (the concentration of H$_2$O is 1 ppb, and the concentration of H$_2$ is 1 ppb), and the dew point of oxygen is set to −112° C.

In the case where a mixed gas of a rare gas and oxygen is used, the flow rate ratio of oxygen is preferably high.

Example of Deposition Condition of Oxide Semiconductor Layer

As an example of the deposition condition, the following condition is employed: the distance between the substrate and the target is 100 mm, the pressure is 0.6 Pa, the direct current (DC) power is 0.5 kW, and the atmosphere is an oxygen atmosphere (the proportion of the oxygen flow rate is 100%). Note that it is preferable that pulsed direct-current (DC) power be used because dust generated during deposition can be reduced and the film thickness can be uniform.

<Method 2 for Forming Oxide Semiconductor Layer with Low Impurity Concentration: First Heat Treatment>

Figure 5B:
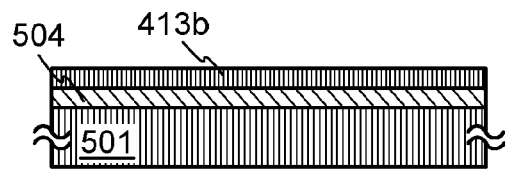
Figure 5C:
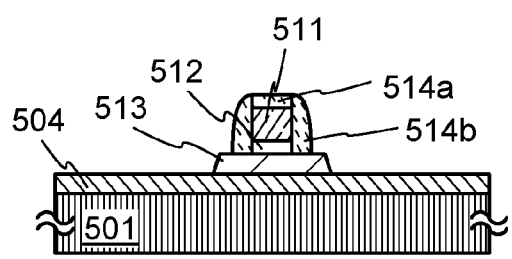

An oxide semiconductor layer 413b from which impurities containing hydrogen atoms are removed as much as possible is formed (see FIG. 5B).

As a method for forming an oxide semiconductor layer in which impurities containing hydrogen atoms are reduced, a method for performing first heat treatment on an oxide semiconductor layer is preferably used in order to reduce impurities such as moisture and hydrogen in the oxide semiconductor layer (in order to perform dehydration or dehydrogenation on the oxide semiconductor layer).

In the case where first heat treatment is performed, an insulating layer from which oxygen is eliminated by heat treatment is preferably used as the insulating layer which is in contact with the oxide semiconductor layer. This is because when the first heat treatment is performed, impurities containing hydrogen atoms and oxygen are released from the oxide semiconductor layer. Some of oxygen vacancies generated in the oxide semiconductor layer from which oxygen is released serve as donors, and carriers are generated in the oxide semiconductor layer, which might influence the characteristics of the transistor.

The temperature of the first heat treatment is, for example, higher than or equal to 150° C. and lower than the strain point of the substrate, preferably higher than or equal to 250° C. and lower than or equal to 450° C., more preferably higher than or equal to 300° C. and lower than or equal to 450° C.

The first heat treatment time is 3 minutes to 24 hours. Heat treatment for longer than 24 hours is not preferable because productivity is reduced.

The first heat treatment is performed in an oxidizing atmosphere or an inert atmosphere. Here, the oxidizing atmosphere is an atmosphere including an oxidizing gas such as oxygen, ozone, or nitrogen oxide at 10 ppm or higher. The inert atmosphere is an atmosphere including the oxidizing gas at lower than 10 ppm and is filled with nitrogen or a rare gas.

For example, the first heat treatment is performed in a reduced-pressure atmosphere, an inert gas atmosphere of nitrogen, a rare gas, or the like, an oxygen gas atmosphere, or ultra dry air (the moisture amount is 20 ppm (−55° C. by conversion into a dew point) or lower, preferably 1 ppm or lower, more preferably 10 ppb or lower, in the case where measurement is performed by a dew point meter in a cavity ring-down laser spectroscopy (CRDS) method).

It is preferable that water, hydrogen, and the like be not contained in nitrogen or a rare gas such as helium, neon, or argon. The purity of nitrogen or a rare gas such as helium, neon, or argon which is introduced into a heat treatment apparatus is preferably 6N (99.9999%) or higher, more preferably 7N (99.99999%) or higher (that is, the impurity concentration is 1 ppm or lower, preferably 0.1 ppm or lower).

There is no particular limitation on the heat treatment apparatus used for the first heat treatment. The heat treatment apparatus may be provided with a device for heating an object by thermal conduction or thermal radiation from a heater such as a resistance heater.

For example, an electric furnace or a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas.

By the first heat treatment, hydrogen (water or a compound having a hydroxyl group) is released from the oxide semiconductor layer. Further, by the first heat treatment, impurities are reduced, so that an intrinsic or substantially intrinsic oxide semiconductor layer can be formed.

Hydrogen that is an unstable carrier source can be eliminated from the oxide semiconductor layer by the first heat treatment; thus, a negative shift in the threshold voltage of the transistor can be inhibited. Further, the reliability of the transistor can be improved.

Modification Example

After the first heat treatment, oxygen (including at least any of an oxygen radical, an oxygen atom, and an oxygen ion) may be introduced into the oxide semiconductor layer.

Ion implantation, ion doping, plasma immersion ion implantation, plasma treatment, or the like can be used as a method for introducing oxygen.

<Structure and Formation Method of Gate Insulating Layer>

At least a region of a gate insulating layer 512 for covering an oxide semiconductor layer 513 having a channel that is in contact with the oxide semiconductor layer preferably includes an insulating layer from which oxygen is eliminated by heat treatment. This is because when the gate insulating layer 512 has an oxygen excess region, transfer of oxygen from the oxide semiconductor layer 513 to the gate insulating layer 512 can be prevented and oxygen can be supplied from the gate insulating layer 512 to the oxide semiconductor layer 513 by second heat treatment to be performed later.

In the case where the insulating layer for covering the oxide semiconductor layer having a channel has a layered structure, an oxide insulating layer having an oxygen excess region is preferably provided on the oxide semiconductor layer side.

For example, the insulating layer for covering the oxide semiconductor layer having a channel preferably has a structure in which a silicon oxide layer having an oxygen excess region and an aluminum oxide layer are stacked in that order from the oxide semiconductor layer side.

This is because the aluminum oxide layer does not transmit oxygen and an impurity such as hydrogen or moisture, that is, has a high blocking effect, and can prevent release of oxygen from the oxide semiconductor layer by performing the second heat treatment after the aluminum oxide layer is formed.

<Formation of Gate Insulating Layer, Gate Electrode, and Insulating Layer over Gate Electrode>

Then, a stack of the gate insulating layer 512, a gate electrode 511, and an insulating layer 514a over the gate electrode is formed over the oxide semiconductor layer 513.

An insulating layer serving as the gate insulating layer and an insulating layer serving as the insulating layer over the gate electrode are formed by plasma-enhanced CVD, sputtering, or the like.

A conductive layer serving as the gate electrode is formed by sputtering or the like.

Next, a resist mask is formed through a photolithography process, and the insulating layer serving as the gate insulating layer, the conductive layer serving as the gate electrode, and the insulating layer serving as the insulating layer over the gate electrode are etched using the resist mask so that the stack of the gate insulating layer 512, the gate electrode 511, and the insulating layer 514a over the gate electrode is formed.

<Formation of Sidewalls>

Then, insulating layers 514b are formed in contact with sidewalls of the stack of the gate insulating layer 512, the gate electrode 511, and the insulating layer 514a over the gate electrode.

An insulating layer serving as sidewalls is formed by plasma-enhanced CVD, sputtering, or the like.

Next, the sidewalls are formed by anisotropic etching while the insulating layer which is in contact with the side surfaces of the stack remains.

<Method 1 for Forming Oxide Semiconductor Layer Supplied with Oxygen: Second Heat Treatment>

An oxide semiconductor layer supplied with oxygen is preferably used as the oxide semiconductor layer 513 in which a channel is formed. In particular, an oxide semiconductor layer in which oxygen vacancies are filled is preferable. This is because some of oxygen vacancies serve as donors and carriers are generated in the oxide semiconductor layer, which might influence the characteristics of the transistor.

As a method for forming an oxide semiconductor layer supplied with oxygen, there is a method by which the second heat treatment is performed under the condition that an insulating layer from which oxygen is eliminated by heat treatment is in contact with an oxide semiconductor layer in which a channel is formed. Specifically, an insulating layer for covering a base insulating layer or/and a region in which a channel is formed may be formed using an insulating layer from which oxygen is eliminated by heat treatment, and oxygen may be supplied to the oxide semiconductor layer by the second heat treatment (see FIG. 5C).

Note that the second heat treatment is effective in any step performed after an insulating layer including an insulating layer from which oxygen is eliminated by heat treatment is formed in contact with a region of the oxide semiconductor layer in which a channel is formed.

In particular, it is preferable that a layered structure in which a silicon oxide layer having an oxygen excess region and an aluminum oxide layer having a high blocking effect are stacked in that order from the oxide semiconductor layer side be employed and that the second heat treatment be performed under the condition that the aluminum oxide layer is formed.

The second heat treatment may be performed in an atmosphere of nitrogen, oxygen, ultra dry air (air in which a water content is 20 ppm or lower, preferably 1 ppm or lower, more preferably 10 ppb or lower), or a rare gas (e.g., argon or helium). It is preferable that water, hydrogen, and the like be not contained in the atmosphere of nitrogen, oxygen, ultra dry air, or a rare gas. The purity of nitrogen, oxygen, or a rare gas which is introduced into a heat treatment apparatus is preferably 6N (99.9999%) or higher, more preferably 7N (99.99999%) or higher (that is, the impurity concentration is 1 ppm or lower, preferably 0.1 ppm or lower).

<Method for Measuring Amount of Eliminated Oxygen Converted into Oxygen Atoms>

A method for quantifying the amount of released oxygen that is converted into oxygen atoms in TDS analysis is described below.

The amount of released gas in TDS analysis is proportional to an integral value of a spectrum. Thus, from the ratio of the integral value of a spectrum of the insulating layer to a reference value of a standard sample, the amount of released gas can be calculated. The reference value of a standard sample is the ratio of density of a predetermined atom contained in a sample to the integral value of a spectrum.

For example, the number of eliminated oxygen molecules ($N_{O2}$) from an insulating layer can be found according to Equation 1 with TDS analysis results of a silicon wafer containing hydrogen at a predetermined density that is the standard sample and TDS analysis results of the insulating layer. Here, all the spectra having a mass number of 32 that are obtained by TDS analysis are assumed to originate from an oxygen molecule. $CH_3OH$, which is given as a gas having a mass number of 32, is not taken into consideration on the assumption that it is unlikely to be present. Further, an oxygen molecule including an oxygen atom having a mass number of 17 or 18 that is an isotope of an oxygen atom is not taken into consideration either because the proportion of such a molecule in the natural world is minimal.

$$N_{O2} = N_{H2}/S_{H2} \times S_{O2} \times \alpha \quad \text{(Equation 1)}.$$

$N_{H2}$ is the value obtained by conversion of the number of hydrogen molecules eliminated from the standard sample into density. $S_{H2}$ is the integral value of a spectrum of the standard sample which is analyzed by TDS. Here, the reference value of the standard sample is set to $N_{H2}/S_{H2}$. $S_{O2}$ is the integral value of a spectrum of the insulating layer which is analyzed by TDS. $\alpha$ is a coefficient which influences spectrum intensity in TDS analysis. Japanese Published Patent Application No. 6-275697 can be referred to for details of Equation 1. Note that the amount of eliminated oxygen was measured with a thermal desorption spectroscopy apparatus produced by ESCO Ltd., EMD-WA1000S/W, using a silicon wafer containing hydrogen atoms at $1 \times 10^{16}$ cm$^{-3}$ as the standard sample.

Further, in TDS analysis, part of oxygen is detected as an oxygen atom. The ratio between oxygen molecules and oxygen atoms can be calculated from the ionization rate of the oxygen molecules. Note that since α includes the ionization rate of oxygen molecules, the number of eliminated oxygen atoms can also be estimated through evaluation of the number of eliminated oxygen molecules.

Note that $N_{O2}$ is the number of eliminated oxygen molecules. In the insulating layer, the amount of eliminated oxygen which is converted into oxygen atoms is twice the number of eliminated oxygen molecules.

An example of a layer from which oxygen is eliminated by heat treatment is a layer of oxygen-excess silicon oxide ($SiO_x$ (x>2)). In oxygen-excess silicon oxide ($SiO_x$ (x>2)), the number of oxygen atoms per unit volume is more than twice the number of silicon atoms per unit volume. The number of silicon atoms and the number of oxygen atoms per unit volume are measured by Rutherford backscattering spectrometry.

<Formation of Electrodes Functioning as Source and Drain Electrodes>

Then, electrodes 551 and 552 functioning as a source and drain electrodes are formed.

A layer which functions as a source and drain electrodes and contains a conductive material is formed by sputtering or the like.

Then, a resist mask is formed through a photolithography process, and the layer containing a conductive material is selectively etched using the resist mask so that the electrodes 551 and 552 are formed. Note that a wiring and the like (not illustrated) made of the layer containing a conductive material are formed in the same step.

Note that in the case where the channel length L of the transistor is 10 nm to 1000 nm (1 μm), especially less than 25 nm, a mask is preferably formed with an extreme ultraviolet ray whose wavelength is several nanometers to several tens of nanometers. This is because an extreme ultraviolet ray can provide a high resolution and a large focus depth.

Note that the electrodes functioning as a source and drain electrodes are preferably tapered. When the electrodes functioning as a source and drain electrodes are tapered, disconnection of a layer to be formed after this step (e.g., a gate insulating layer) can be prevented, so that coverage can be improved. The taper angle is preferably 30 to 60°, for example.

Note that in the case where the layer containing a conductive material has a single-layer structure of a titanium layer or a titanium nitride layer, the layer containing a conductive material can be easily processed into a tapered source and drain electrodes.

<Formation of Insulating Layer for Protecting Transistor>

Next, an insulating layer 505 for protecting the transistor is formed.

Figure 5D:
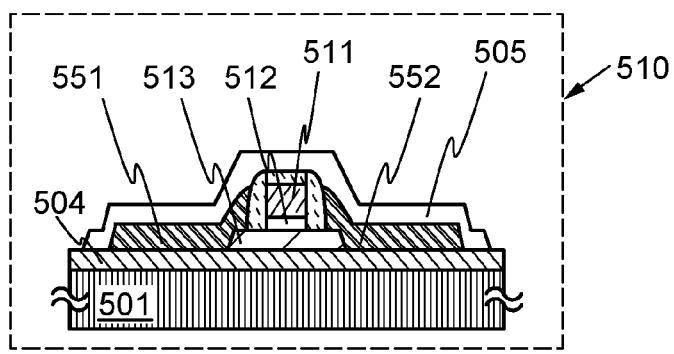

The insulating layer for protecting the transistor is formed by plasma-enhanced CVD, sputtering, or the like (see FIG. 5D).

Since generation of carriers in the oxide semiconductor layer in which a channel is formed can be inhibited as described above, changes in transistor characteristics can be inhibited.

This embodiment can be combined with any of the structures described in the other embodiments as appropriate.

Embodiment 7

In this embodiment, an oxide semiconductor layer applicable to a transistor which has extremely low off-state leakage current (for example, off-state leakage current per micrometer of channel width is $1 \times 10^{-17}$ A or lower) and can be used in a trimming circuit according to one embodiment of the present invention is described. Specifically, an oxide semiconductor layer having c-axis aligned crystals is described.

In this embodiment, an oxide including a c-axis aligned crystal (CAAC) that has triangular or hexagonal atomic order when seen from the direction of the a-b plane, a surface, or an interface is described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

A CAAC-OS film is not completely single crystal nor completely amorphous. The CAAC-OS film is an oxide semiconductor film with a crystal-amorphous mixed phase structure where crystal parts and amorphous parts are included in an amorphous phase. Note that in most cases, the crystal part fits into a cube whose one side is less than 100 nm. From an observation image obtained with a transmission electron microscope (TEM), a boundary between the amorphous part and the crystal part in the CAAC-OS film is not clear. Further, with the TEM, a grain boundary in the CAAC-OS film is not found. Thus, in the CAAC-OS film, a decrease in electron mobility due to the grain boundary is inhibited.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic order which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85 to 95°. In addition, a simple term "parallel" includes a range from −5 to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the CAAC-OS film is higher than that in the vicinity of the surface where the CAAC-OS film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to the normal vector of the surface where the CAAC-OS film is formed or the normal vector of the surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to the normal vector of the surface where the CAAC-OS film is formed or the normal vector of the surface of the CAAC-OS film. The crystal part is formed by deposition or by performing treatment for crystallization such as heat treatment after deposition.

With the use of the CAAC-OS film in a transistor, changes in electrical characteristics of the transistor due to irradiation with visible light or ultraviolet light can be reduced. Thus, the transistor has high reliability.

In a broad sense, an oxide including CAAC means a non-single-crystal oxide including a phase which has triangular, hexagonal, regular triangular, or regular hexagonal atomic order when seen from the direction perpendicular to the a-b plane and in which metal atoms are arranged in a layered manner or metal atoms and oxygen atoms are arranged in a layered manner when seen from the direction perpendicular to the c-axis direction.

CAAC is not a single crystal but this does not mean that CAAC is composed of only an amorphous component. Although CAAC includes a crystallized portion (a crystalline portion), a boundary between one crystalline portion and another crystalline portion is not clear in some cases.

In the case where oxygen is included in CAAC, nitrogen may be substituted for part of oxygen included in CAAC. The c-axes of the crystalline parts included in CAAC may be aligned in a certain direction (e.g., a direction perpendicular to a surface of a substrate over which CAAC is formed or a surface of CAAC). The normals of the a-b planes of the crystalline parts included in CAAC may be aligned in a certain direction (e.g., a direction perpendicular to a surface of a substrate over which CAAC is formed or a surface of CAAC).

CAAC is a conductor, a semiconductor, or an insulator depending on its composition or the like. CAAC transmits or does not transmit visible light depending on its composition or the like.

As an example of such CAAC, there is a crystal which is formed into a film shape and has triangular or hexagonal atomic order when seen from the direction perpendicular to a surface of the film or a surface of a support substrate, and in which metal atoms are arranged in a layered manner or metal atoms and oxygen atoms (or nitrogen atoms) are arranged in a layered manner when a cross section of the film is observed.

Examples of a crystal structure of CAAC are described in detail with reference to FIGS. 6A to 6E, FIGS. 7A to 7C, and FIGS. 8A to 8C. Note that in FIGS. 6A to 6E, FIGS. 7A to 7C, and FIGS. 8A to 8C, the vertical direction corresponds to the c-axis direction and a plane perpendicular to the c-axis direction corresponds to the a-b plane, unless otherwise specified. When terms "upper half" and "lower half" are simply used, they refer to an upper half above the a-b plane and a lower half below the a-b plane (an upper half and a lower half with respect to the a-b plane). Further, in FIGS. 6A to 6E, an O atom surrounded by a circle represents a tetracoordinate O atom and an O atom surrounded by a double circle represents a tricoordinate O atom.

Figure 6A:
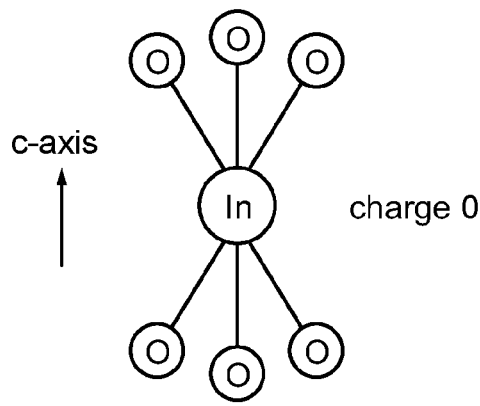
FIGS. 6A to 6E each illustrate the structure of an oxide material according to one embodiment.

FIG. 6A illustrates a structure including one hexacoordinate In atom and six tetracoordinate oxygen atoms (hereinafter referred to as tetracoordinate O atoms) close to the In atom. A structure in which one metal atom and oxygen atoms close to the metal atom are only illustrated is called a small group here. The structure in FIG. 6A is actually an octahedral structure, but is illustrated as a planar structure for simplicity. Note that three tetracoordinate O atoms exist in each of an upper half and a lower half in FIG. 6A. In the small group illustrated in FIG. 6A, electric charge is 0.

Figure 6D:
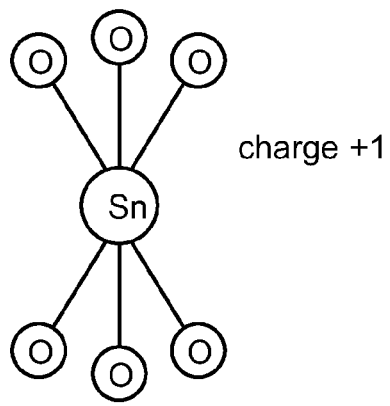
Figure 6B:
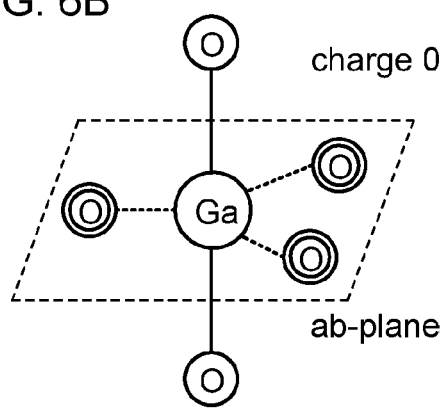

FIG. 6B illustrates a structure including one pentacoordinate Ga atom, three tricoordinate oxygen atoms (hereinafter referred to as tricoordinate O atoms) close to the Ga atom, and two tetracoordinate O atoms close to the Ga atom. All the tricoordinate O atoms exist in the a-b plane. One tetracoordinate O atom exists in each of an upper half and a lower half in FIG. 6B. An In atom can have the structure illustrated in FIG. 6B because the In atom can have five ligands. In a small group illustrated in FIG. 6B, electric charge is 0.

Figure 6E:
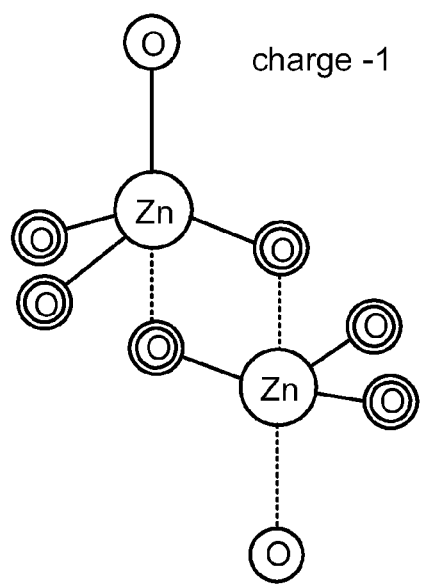
Figure 6C:
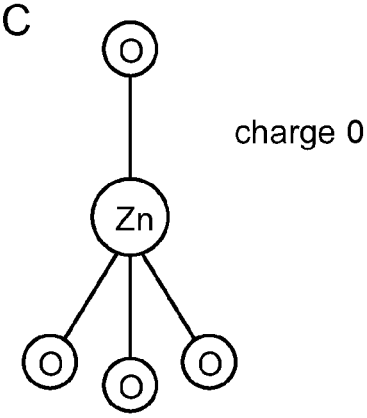

FIG. 6C illustrates a structure including one tetracoordinate Zn atom and four tetracoordinate O atoms close to the Zn atom. In FIG. 6C, one tetracoordinate O atom exists in an upper half and three tetracoordinate O atoms exists in a lower half. Alternatively, three tetracoordinate O atoms may exist in the upper half and one tetracoordinate O atom may exist in the lower half in FIG. 6C. In a small group illustrated in FIG. 6C, electric charge is 0.

FIG. 6D illustrates a structure including one hexacoordinate Sn atom and six tetracoordinate O atoms close to the Sn atom. In FIG. 6D, three tetracoordinate O atoms exists in each of an upper half and a lower half In a small group illustrated in FIG. 6D, electric charge is +1.

FIG. 6E illustrates a small group including two Zn atoms. In FIG. 6E, one tetracoordinate O atom exists in each of an upper half and a lower half. In the small illustrated in FIG. 6E, electric charge is −1.

Here, a plurality of small groups form a medium group, and a plurality of medium groups form a large group (also referred to as a unit cell).

Here, a rule of bonding the small groups to each other is described. The three O atoms in the upper half with respect to the hexacoordinate In atom in FIG. 6A each have three proximity In atoms in the downward direction, and the three O atoms in the lower half each have three proximity In atoms in the upward direction. The one O atom in the upper half with respect to the pentacoordinate Ga atom in FIG. 6B has one proximity Ga atom in the downward direction, and the one O atom in the lower half has one proximity Ga atom in the upward direction. The one O atom in the upper half with respect to the tetracoordinate Zn atom in FIG. 6C has one proximity Zn atom in the downward direction, and the three O atoms in the lower half each have three proximity Zn atoms in the upward direction. In this manner, the number of the tetracoordinate O atoms above the metal atom is equal to the number of the proximity metal atoms below the tetracoordinate O atoms. Similarly, the number of the tetracoordinate O atoms below the metal atom is equal to the number of the proximity metal atoms above the tetracoordinate O atoms. Since the coordination number of the O atom is 4, the sum of the number of the proximity metal atoms below the O atom and the number of the proximity metal atoms above the O atom is 4. Accordingly, when the sum of the number of the tetracoordinate O atoms above the metal atom and the number of the tetracoordinate O atoms below another metal atom is 4, the two kinds of small groups including the metal atoms can be bonded to each other. For example, in the case where a hexacoordinate metal (In or Sn) atom is bonded through three tetracoordinate O atoms in the upper half, the hexacoordinate metal atom is bonded to a pentacoordinate metal (Ga or In) atom or a tetracoordinate metal (Zn) atom.

A metal atom having the above coordination number is bonded to another metal atom through a tetracoordinate O atom in the c-axis direction. Further, a plurality of small groups are bonded to each other so that the total electric charge in a layer structure is 0. Thus, a medium group is constituted.

Figure 7A:
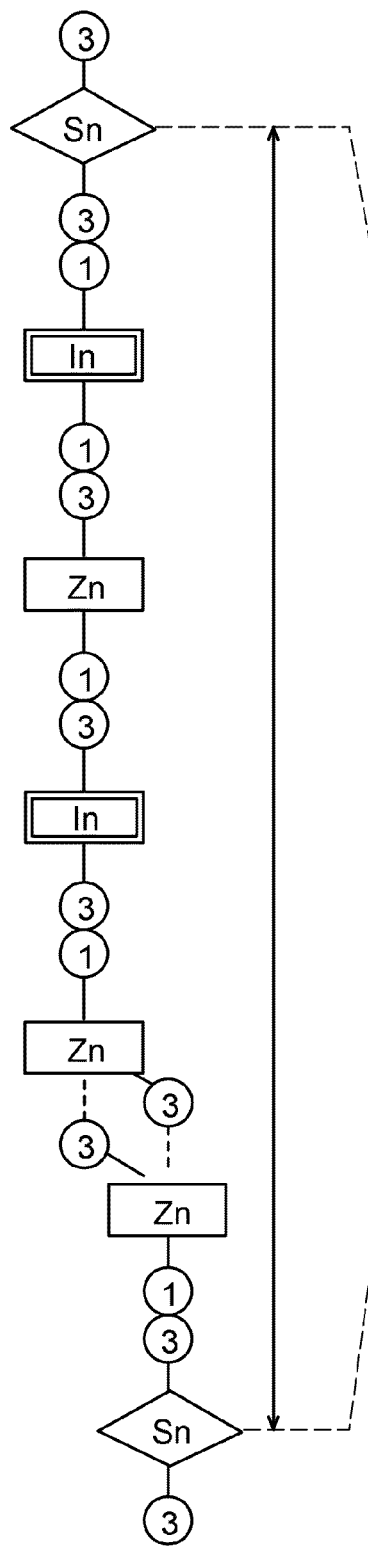
FIGS. 7A to 7C illustrate the structure of an oxide material according to one embodiment.
Figure 7B:
Figure 7C:
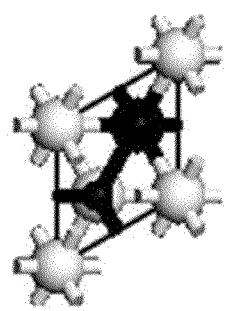

FIG. 7A illustrates a model of a medium group included in a layer structure of an In—Sn—Zn—O-based material. FIG. 7B illustrates a large group including three medium groups. Note that FIG. 7C illustrates atomic order in the case of the layer structure in FIG. 7B observed from the c-axis direction.

In FIG. 7A, for simplicity, a tricoordinate O atom is not illustrated and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 7A, one tetracoordinate O atom existing in each of an upper half and a lower half with respect to an In atom is denoted by circled 1. FIG. 7A also illustrates a Zn atom close to one tetracoordinate O atom in a lower half and three tetracoordinate O atoms in an upper half, and a Zn atom close to one tetracoordinate O atom in an upper half and three tetracoordinate O atoms in a lower half.

In the medium group included in the layer structure of the In—Sn—Zn—O-based material in FIG. 7A, in the order starting from the top, a Sn atom close to three tetracoordinate O atoms in each of an upper half and a lower half is bonded to an In atom close to one tetracoordinate O atom in each of an upper half and a lower half, the In atom is bonded to a Zn atom close to three tetracoordinate O atoms in an upper half, the Zn atom is bonded to an In atom close to three tetracoordinate O atoms in each of an upper half and a lower half through one tetracoordinate O atom in a lower half with respect to the Zn atom, the In atom is bonded to a small group that includes two Zn atoms and is close to one tetracoordinate O atom in an upper half, and the small group is bonded to a Sn atom close to three tetracoordinate O atoms in each of an upper half and a lower half through one tetracoordinate O atom in a lower half with respect to the small group. A plurality of such medium groups are bonded to each other so that a large group is constituted.

Here, electric charge for one bond of a tricoordinate O atom and electric charge for one bond of a tetracoordinate O atom can be assumed to be −0.667 and −0.5, respectively. For example, electric charge of a hexacoordinate or pentacoordinate In atom, electric charge of a tetracoordinate Zn atom, and electric charge of a pentacoordinate or hexacoordinate Sn atom are +3, +2, and +4, respectively. Thus, electric charge of a small group including a Sn atom is +1. Consequently, an electric charge of −1, which cancels an electric charge of +1, is needed to form a layer structure including a Sn atom. As a structure having an electric charge of −1, the small group including two Zn atoms as illustrated in FIG. 6E can be given. For example, when one small group including two Zn atoms is provided for one small group including a Sn atom, electric charge is canceled, so that the total electric charge in the layer structure can be 0.

Specifically, when a large group illustrated in FIG. 7B is formed, an In—Sn—Zn—O-based crystal ($In_2SnZn_3O_8$) can be obtained. Note that the layer structure of the obtained In—Sn—Zn—O-based crystal can be expressed as a composition formula, $In_2SnZn_2O_7(ZnO)_m$ (m is 0 or a natural number).

The above rule also applies to the following oxides: a quaternary metal oxide such as an In—Sn—Ga—Zn—O-based oxide; a ternary metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a binary metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 8A:
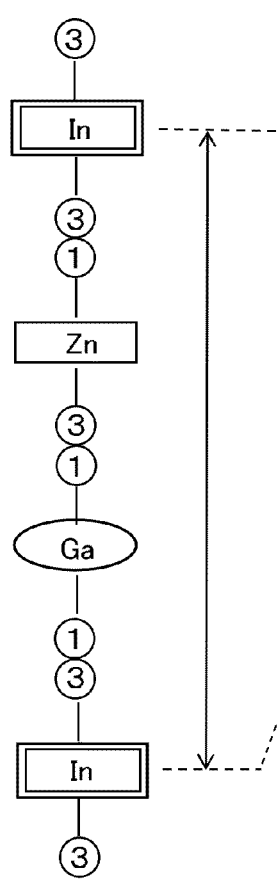
FIGS. 8A to 8C illustrate the structure of an oxide material according to one embodiment.

For example, FIG. 8A illustrates a model of a medium group included in a layer structure of an In—Ga—Zn—O-based material.

In the medium group included in the layer structure of the In—Ga—Zn—O-based material in FIG. 8A, in the order starting from the top, an In atom close to three tetracoordinate O atoms in each of an upper half and a lower half is bonded to a Zn atom close to one tetracoordinate O atom in an upper half, the Zn atom is bonded to a Ga atom close to one tetracoordinate O atom in each of an upper half and a lower half through three tetracoordinate O atoms in a lower half with respect to the Zn atom, and the Ga atom is bonded to an In atom close to three tetracoordinate O atoms in each of an upper half and a lower half through one tetracoordinate O atom in a lower half with respect to the Ga atom. A plurality of such medium groups are bonded to each other so that a large group is constituted.

Figure 8B:
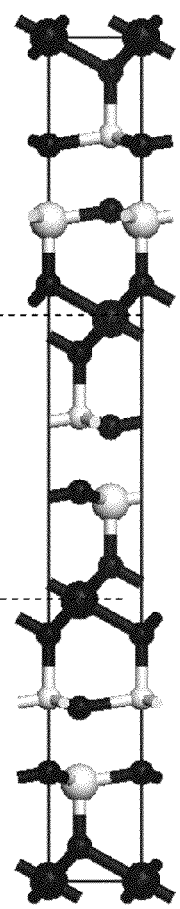
Figure 8C:
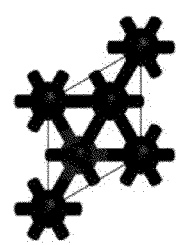

FIG. 8B illustrates a large group including three medium groups. Note that FIG. 8C illustrates atomic order in the case of the layer structure in FIG. 8B observed from the c-axis direction.

Here, since electric charge of a hexacoordinate or pentacoordinate In atom, electric charge of a tetracoordinate Zn atom, and electric charge of a pentacoordinate Ga atom are +3, +2, and +3, respectively, electric charge of a small group including any of an In atom, a Zn atom, and a Ga atom is 0. Thus, the total electric charge of a medium group having a combination of such small groups is always 0.

In order to form the layer structure of the In—Ga—Zn—O-based material, a large group can be formed using not only the medium group illustrated in FIG. 8A but also a medium group in which arrangement of an In atom, a Ga atom, and a Zn atom is different from that in FIG. 8A.

Specifically, when a large group illustrated in FIG. 8B is formed, an In—Ga—Zn—O-based crystal can be obtained. Note that the layer structure of the obtained In—Ga—Zn—O-based crystal can be expressed as a composition formula, $In_2GaO_3(ZnO)_n$ (n is a natural number).

Figure 9A:
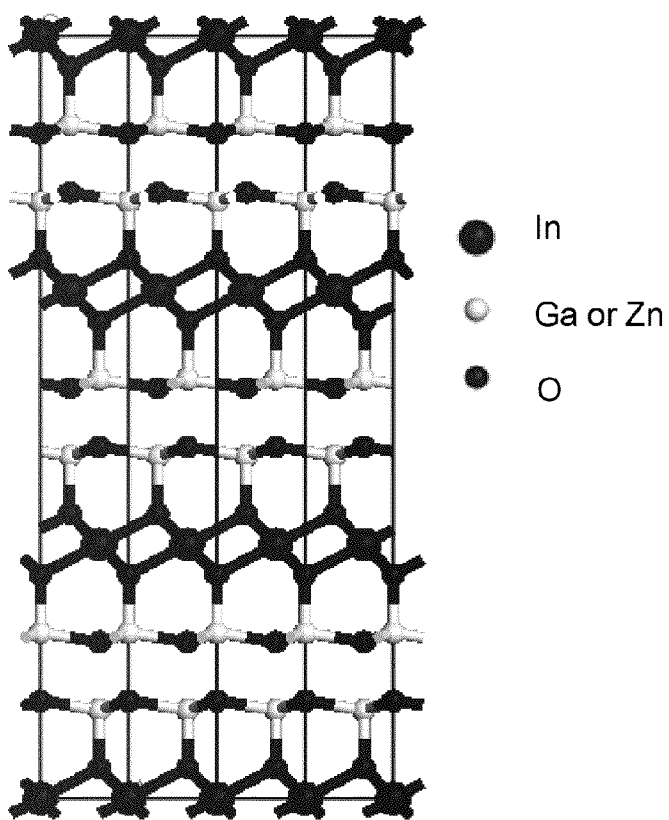
FIGS. 9A and 9B each illustrate the structure of an oxide material according to one embodiment.

In the case where n=1 ($InGaZnO_4$), a crystal structure illustrated in FIG. 9A can be obtained, for example. Note that in the crystal structure illustrated in FIG. 9A, since a Ga atom and an In atom each have five ligands as described in FIG. 6B, a structure in which a Ga atom is replaced with an In atom can be obtained.

Figure 9B:
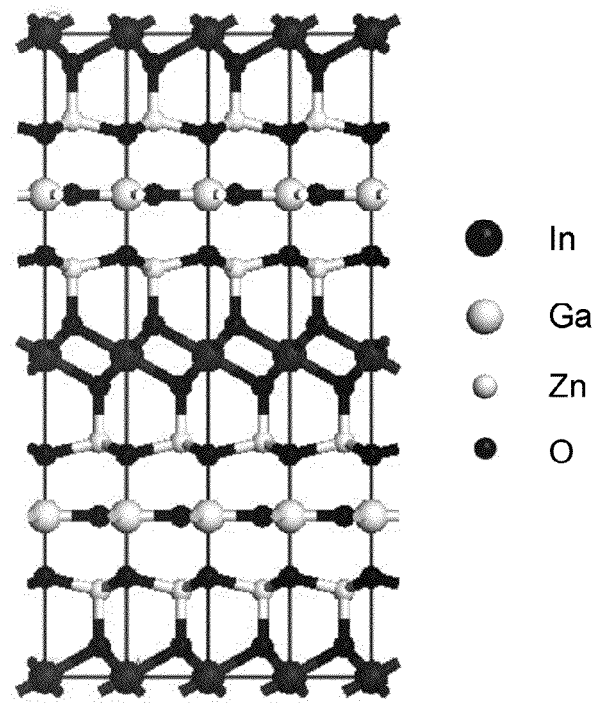

In the case where n=2 ($InGaZn_2O_5$), a crystal structure illustrated in FIG. 9B can be obtained, for example. Note that in the crystal structure illustrated in FIG. 9B, since a Ga atom and an In atom each have five ligands as described in FIG. 6B, a structure in which a Ga atom is replaced with an In atom can be obtained.

When a transistor according to one embodiment of the present invention includes an oxide semiconductor layer having CAAC in a channel formation region, the transistor can have high reliability, which is preferable.

This embodiment can be combined with any of the structures described in the other embodiments as appropriate.

This application is based on Japanese Patent Application serial No. 2011-119429 filed with Japan Patent Office on May 27, 2011, the entire contents of which are hereby incorporated by reference.

What is claimed is:

1. A trimming circuit comprising:
   a capacitor;
   a first transistor;
   a second transistor; and
   a third transistor,
   wherein one electrode of the capacitor is electrically connected to a storage node, and the other electrode of the capacitor is electrically connected to a ground potential line,
   wherein a gate electrode of the first transistor is electrically connected to a write terminal, one of a source electrode and a drain electrode of the first transistor is electrically connected to the storage node, and the other of the source electrode and the drain electrode of the first transistor is electrically connected to a power supply potential line,
   wherein a gate electrode of the second transistor is electrically connected to an erase terminal, one of a source electrode and a drain electrode of the second transistor is electrically connected to the storage node, and the other of the source electrode and the drain electrode of the second transistor is electrically connected to a ground potential line,
   wherein a gate electrode of the third transistor is electrically connected to the storage node,
   wherein the first transistor and the second transistor each include a semiconductor material whose bandgap is 2.5 eV or more, and
   wherein a source electrode and a drain electrode of the third transistor are electrically connected in parallel to a resistor.

2. The trimming circuit according to claim 1, wherein the first transistor and the second transistor each include an oxide semiconductor layer.

3. A trimming circuit comprising:
   a capacitor;
   a first transistor;
   a second transistor; and
   a third transistor,
   wherein one electrode of the capacitor is electrically connected to a storage node, and the other electrode of the capacitor is electrically connected to a ground potential line,
   wherein a gate electrode of the first transistor is electrically connected to a write terminal, one of a source electrode and a drain electrode of the first transistor is electrically connected to the storage node, and the other of the source electrode and the drain electrode of the first transistor is electrically connected to a power supply potential line,
   wherein a gate electrode of the second transistor is electrically connected to an erase terminal, one of a source electrode and a drain electrode of the second transistor is electrically connected to the storage node, and the other of the source electrode and the drain electrode of the second transistor is electrically connected to a ground potential line,
   wherein a gate electrode of the third transistor is electrically connected to the storage node,
   wherein off-state leakage current per micrometer of channel width of each of the first transistor and the second transistor is $1 \times 10^{-17}$ A or lower, and
   wherein a source electrode and a drain electrode of the third transistor are electrically connected in parallel to a resistor.

4. The trimming circuit according to claim 3, wherein the first transistor and the second transistor each include an oxide semiconductor layer in a channel formation region.

5. A method for driving a trimming circuit, the trimming circuit comprising:
   a capacitor, a first transistor, a second transistor, and a third transistor,
   wherein one electrode of the capacitor is electrically connected to a storage node, and the other electrode of the capacitor is electrically connected to a ground potential line,
   wherein a gate electrode of the first transistor is electrically connected to a write terminal, one of a source electrode and a drain electrode of the first transistor is electrically connected to the storage node, and the other of the source electrode and the drain electrode of the first transistor is electrically connected to a power supply potential line,
   wherein a gate electrode of the second transistor is electrically connected to an erase terminal, one of a source electrode and a drain electrode of the second transistor is electrically connected to the storage node, and the other of the source electrode and the drain electrode of the second transistor is electrically connected to a ground potential line, wherein a gate electrode of the third transistor is electrically connected to the storage node, wherein off-state leakage current per micrometer of channel width of each of the first transistor and the second transistor is $1\times10^{-17}$ A or lower, and wherein a source electrode and a drain electrode of the third transistor are electrically connected in parallel to a resistor, the method comprising:

a first step of inputting a signal by which the first transistor is turned on and a signal by which the second transistor is turned off to the write terminal and the erase terminal, respectively, so that a potential of the storage node is a potential at which the third transistor is turned on; and a second step of inputting a signal by which the first transistor is turned off and a signal by which the second transistor is turned off to the write terminal and the erase terminal, respectively, so that the resistor is in a trimming state.

6. The method for driving a trimming circuit according to claim 5, further comprising:

a third step of making the potential of the storage node different from the potential of the storage node in the second step by inputting a signal by which the first transistor is turned on and a signal by which the second transistor is turned off to the write terminal and the erase terminal, respectively, so that the potential of the storage node is a potential at which the third transistor is turned on or by inputting a signal by which the first transistor is turned off and a signal by which the second transistor is turned on to the write terminal and the erase terminal, respectively, so that the potential of the storage node is a potential at which the third transistor is turned off, after the second step; and a fourth step of inputting a signal by which the first transistor is turned off and a signal by which the second transistor is turned off to the write terminal and the erase terminal, respectively.

7. The method for driving a trimming circuit according to claim 5, wherein more current flows to the third transistor than to the resistor in the trimming state.

8. A method for driving a trimming circuit, the trimming circuit comprising:

a capacitor, a first transistor, a second transistor, and a third transistor, wherein one electrode of the capacitor is electrically connected to a storage node, and the other electrode of the capacitor is electrically connected to a ground potential line, wherein a gate electrode of the first transistor is electrically connected to a write terminal, one of a source electrode and a drain electrode of the first transistor is electrically connected to the storage node, and the other of the source electrode and the drain electrode of the first transistor is electrically connected to a power supply potential line, wherein a gate electrode of the second transistor is electrically connected to an erase terminal, one of a source electrode and a drain electrode of the second transistor is electrically connected to the storage node, and the other of the source electrode and the drain electrode of the second transistor is electrically connected to a ground potential line, wherein a gate electrode of the third transistor is electrically connected to the storage node, wherein off-state leakage current per micrometer of channel width of each of the first transistor and the second transistor is $1\times10^{-17}$ A or lower, and wherein a source electrode and a drain electrode of the third transistor are electrically connected in parallel to a resistor, the method comprising:

a first step of inputting a signal by which the first transistor is turned off and a signal by which the second transistor is turned on to the write terminal and the erase terminal, respectively, so that a potential of the storage node is a potential at which the third transistor is turned off; and a second step of inputting a signal by which the first transistor is turned off and a signal by which the second transistor is turned off to the write terminal and the erase terminal, respectively, so that the resistor is in an available state.

9. The method for driving a trimming circuit according to claim 8, further comprising:

a third step of making the potential of the storage node different from the potential of the storage node in the second step by inputting a signal by which the first transistor is turned on and a signal by which the second transistor is turned off to the write terminal and the erase terminal, respectively, so that the potential of the storage node is a potential at which the third transistor is turned on or by inputting a signal by which the first transistor is turned off and a signal by which the second transistor is turned on to the write terminal and the erase terminal, respectively, so that the potential of the storage node is a potential at which the third transistor is turned off, after the second step; and a fourth step of inputting a signal by which the first transistor is turned off and a signal by which the second transistor is turned off to the write terminal and the erase terminal, respectively.

10. The method for driving a trimming circuit according to claim 8, wherein more current flows to the resistor than to the third transistor in the available state.

* * * * *